(12) United States Patent
Bencher et al.

(10) Patent No.: US 10,761,430 B2
(45) Date of Patent: Sep. 1, 2020

(54) METHOD TO ENHANCE THE RESOLUTION OF MASKLESS LITHOGRAPHY WHILE MAINTAINING A HIGH IMAGE CONTRAST

(71) Applicant: Applied Materials, Inc., Santa Clara, CA (US)

(72) Inventors: Christopher Dennis Bencher, Cupertino, CA (US); Joseph R. Johnson, Redwood City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/512,975

(22) Filed: Jul. 16, 2019

(65) Prior Publication Data
US 2020/0089128 A1 Mar. 19, 2020

Related U.S. Application Data

(60) Provisional application No. 62/730,997, filed on Sep. 13, 2018.

(51) Int. Cl.
*G03F 7/20* (2006.01)
(52) U.S. Cl.
CPC ........ *G03F 7/70291* (2013.01); *G03F 7/7045* (2013.01); *G03F 7/70275* (2013.01); *G03F 7/70466* (2013.01); *G03F 7/70508* (2013.01)
(58) Field of Classification Search
CPC ............. G03F 7/70291; G03F 7/70275; G03F 7/7045; G03F 7/70466; G03F 7/70508
See application file for complete search history.

(56) References Cited

U.S. PATENT DOCUMENTS

| 5,691,541 A | 11/1997 | Ceglio et al. |
| 6,498,685 B1 * | 12/2002 | Johnson ................ B81C 1/0038 347/241 |
| 6,777,146 B1 * | 8/2004 | Samuels ................ G06F 30/00 430/30 |
| 9,304,410 B2 * | 4/2016 | Markle ............... G03F 7/70191 |

(Continued)

FOREIGN PATENT DOCUMENTS

| WO | 2015060972 A1 | 4/2015 |
| WO | 2017114653 A1 | 7/2017 |

OTHER PUBLICATIONS

International Search Report and Written Opinion for PCT/US2019/046489 dated Dec. 2, 2019.

*Primary Examiner* — Deoram Persaud
(74) *Attorney, Agent, or Firm* — Patterson + Sheridan LLP

(57) ABSTRACT

The embodiments described herein relate to a software application platform, which enhances image patterns resolution on a substrate. The application platform method includes running an algorithm to provide different target polygons for forming a pattern on a target. A minimum feature size which may be formed by a DMD is determined. For each target polygons smaller than the minimum feature size determining to line bias or shot bias the one or more target polygons to achieve an acceptable exposure contrast at the target polygon boundary. The one or more target polygons smaller than the minimum feature size are biased to form a digitized pattern on the substrate. Electromagnetic radiation is delivered to reflect off of a first mirror of the DMD when the centroid for the first mirror is within the one or more target polygons.

20 Claims, 18 Drawing Sheets

(56) References Cited

U.S. PATENT DOCUMENTS

| | | |
|---|---|---|
| 9,519,226 B2 | 12/2016 | Chen et al. |
| 9,791,786 B1 | 10/2017 | Johnson et al. |
| 2003/0197842 A1* | 10/2003 | Tsacoyeanes ....... G03F 7/70091 355/53 |
| 2004/0053143 A1 | 3/2004 | Sandstrom |
| 2005/0053850 A1* | 3/2005 | Askebjer ............. G03F 7/70291 430/5 |
| 2006/0170899 A1* | 8/2006 | De Kruif ............ G03F 7/70625 355/69 |
| 2007/0097485 A1* | 5/2007 | Yang .................. G02B 26/0841 359/290 |
| 2009/0111056 A1 | 4/2009 | Hendel et al. |
| 2009/0147345 A1 | 6/2009 | Sandstrom |
| 2009/0246706 A1 | 10/2009 | Hendel et al. |
| 2011/0179393 A1* | 7/2011 | Xue ........................ G03F 7/705 716/55 |
| 2014/0206111 A1* | 7/2014 | Tanaka .................... H01L 22/20 438/16 |
| 2015/0040077 A1* | 2/2015 | Ho ...................... G03F 7/70433 716/51 |
| 2016/0085156 A1 | 3/2016 | Markle |
| 2017/0068163 A1* | 3/2017 | Laidig .................. G03F 7/2051 |
| 2017/0184979 A1* | 6/2017 | Hsu ....................... G03F 7/7085 |

* cited by examiner

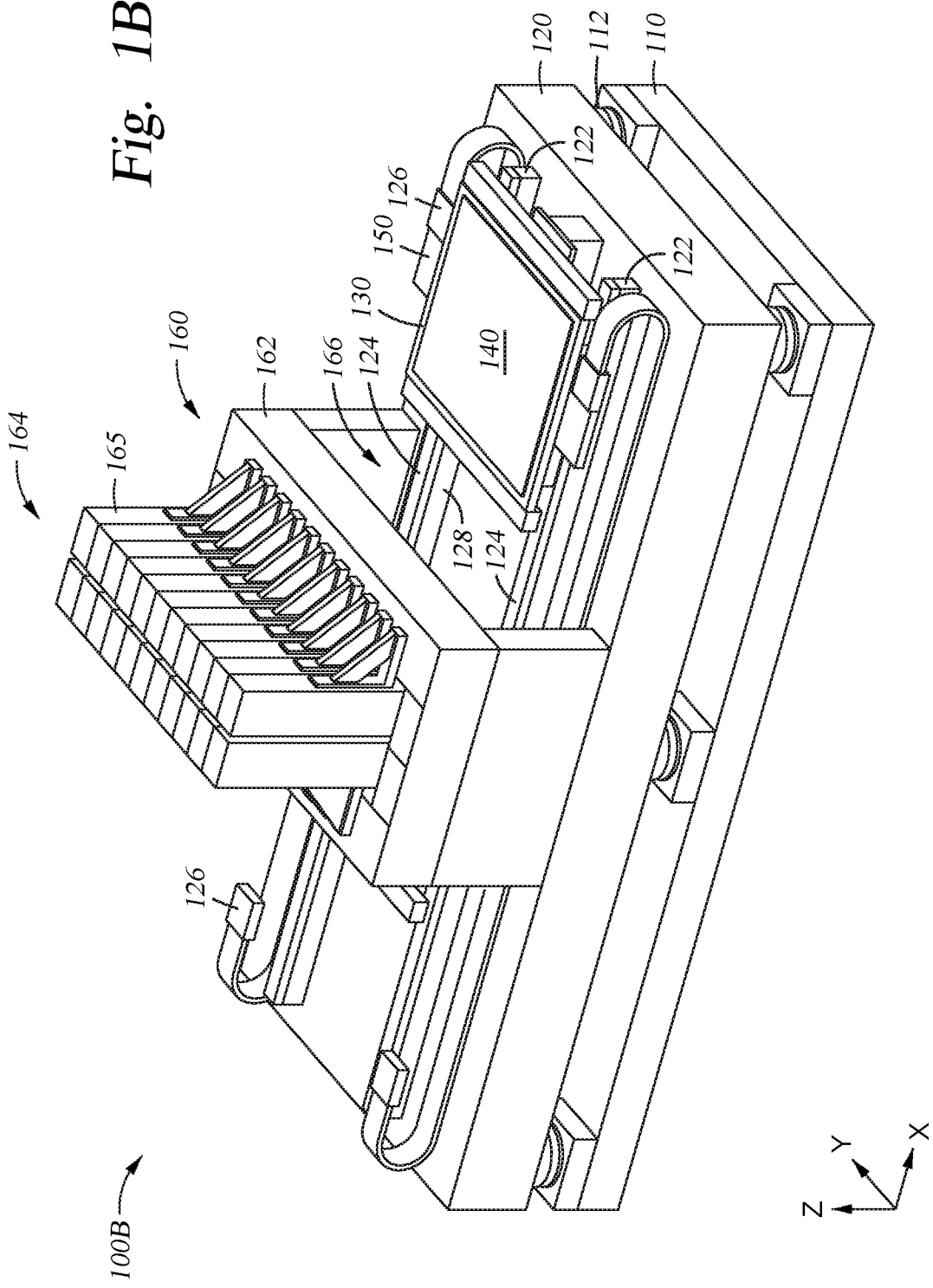

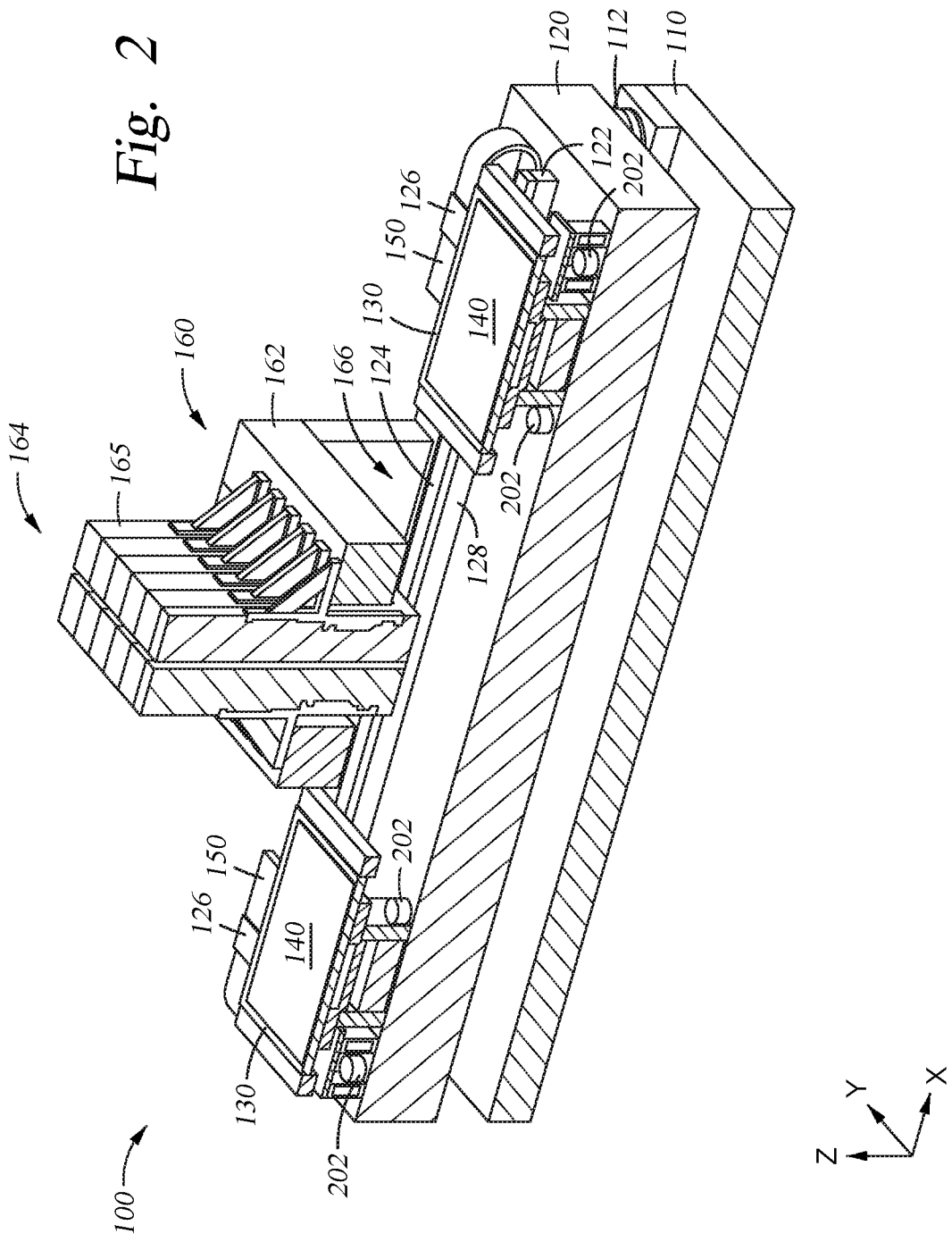

METHOD TO ENHANCE THE RESOLUTION OF MASKLESS LITHOGRAPHY WHILE MAINTAINING A HIGH IMAGE CONTRAST

CROSS-REFERENCE TO RELATED APPLICATIONS

This application claims benefit of U.S. Provisional Application Ser. No. 62/730,997, filed Sep. 13, 2018, of which is incorporated by reference in its entirety.

BACKGROUND

Field

Embodiments of the present disclosure generally relate to the field of maskless lithography. More specifically, embodiments provided herein relate to a system and method for performing maskless digital lithography manufacturing processes.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated. As higher resolution displays become more in demand, the pixel locations become smaller and smaller.

Microlithography techniques are generally employed to create electrical features incorporated as part of the liquid crystal material layer forming the pixels. According to this technique, a light-sensitive photoresist is typically applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide higher resolution display devices and other devices to consumers at the prices demanded by consumers, new apparatuses, approaches, and systems are needed to precisely and cost-effectively create the ever smaller patterns on substrates, such as large area substrates used to produce high resolution displays.

As the foregoing illustrates, there is a need for an improved technique for generating smaller patterns.

SUMMARY

An image resolution enhancing application relating to the ability to apply maskless lithography patterns to a substrate while maintaining a high image contrast in a manufacturing process is disclosed. The embodiments described herein relate to a software application platform, which enhances image patterns resolution on a substrate. The application platform method includes running an algorithm to provide different target polygons for forming a pattern on a target. A minimum feature size which may be formed by a DMD is determined. For each target polygons smaller than the minimum feature size determining to line bias or shot bias the one or more target polygons to achieve a predetermined exposure contrast at the target polygon boundary. The one or more target polygons smaller than the minimum feature size are biased to form a digitized pattern on the substrate. Electromagnetic radiation is delivered to reflect off of a first mirror of the DMD when the centroid for the first mirror is within the one or more target polygons.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

FIG. 1B is a perspective view of a single substrate photolithography system according to another embodiments disclosed herein.

FIG. 2 is a cross-sectional side view of the system of FIG. 1A according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure generally relate to a software application relating to the ability to apply maskless lithography patterns to a substrate in a manufacturing process is disclosed. The software application enhances the native resolution for maskless lithography while maintaining a high image contrast. The maskless lithography operation utilizes a method wherein the number of shots of electromagnetic energy reflected off a digital micro-mirror device (DMD) is biased or the target polygon size is biased to form features below the native resolution of the DMD. Advantageously, higher resolution can be extended to DMD's suitably arranged for forming lower resolution devices on the substrate without any hardware modification. For example, a lower resolution DMD suitable for forming 3.6 μm features can be extended to form higher resolution, i.e., smaller, features such as a 2.35 μm feature. This method can similarly be extended for forming 0.6 μm features or smaller. The size of the mirrors along with hardware optics determine the feature sizes the DMD can form. The method described below extends the capabilities of the DMD for forming features sized smaller than the hardware optics and mirrors sizes conventionally allow.

The term "user" as used herein includes, for example, a person or entity that owns a computing device or wireless device; a person or entity that operates or utilizes a computing device or a wireless device; or a person or entity that is otherwise associated with a computing device or a wireless device. It is contemplated that the term "user" is not intended to be limiting and may include various examples beyond those described.

Figure 1A:
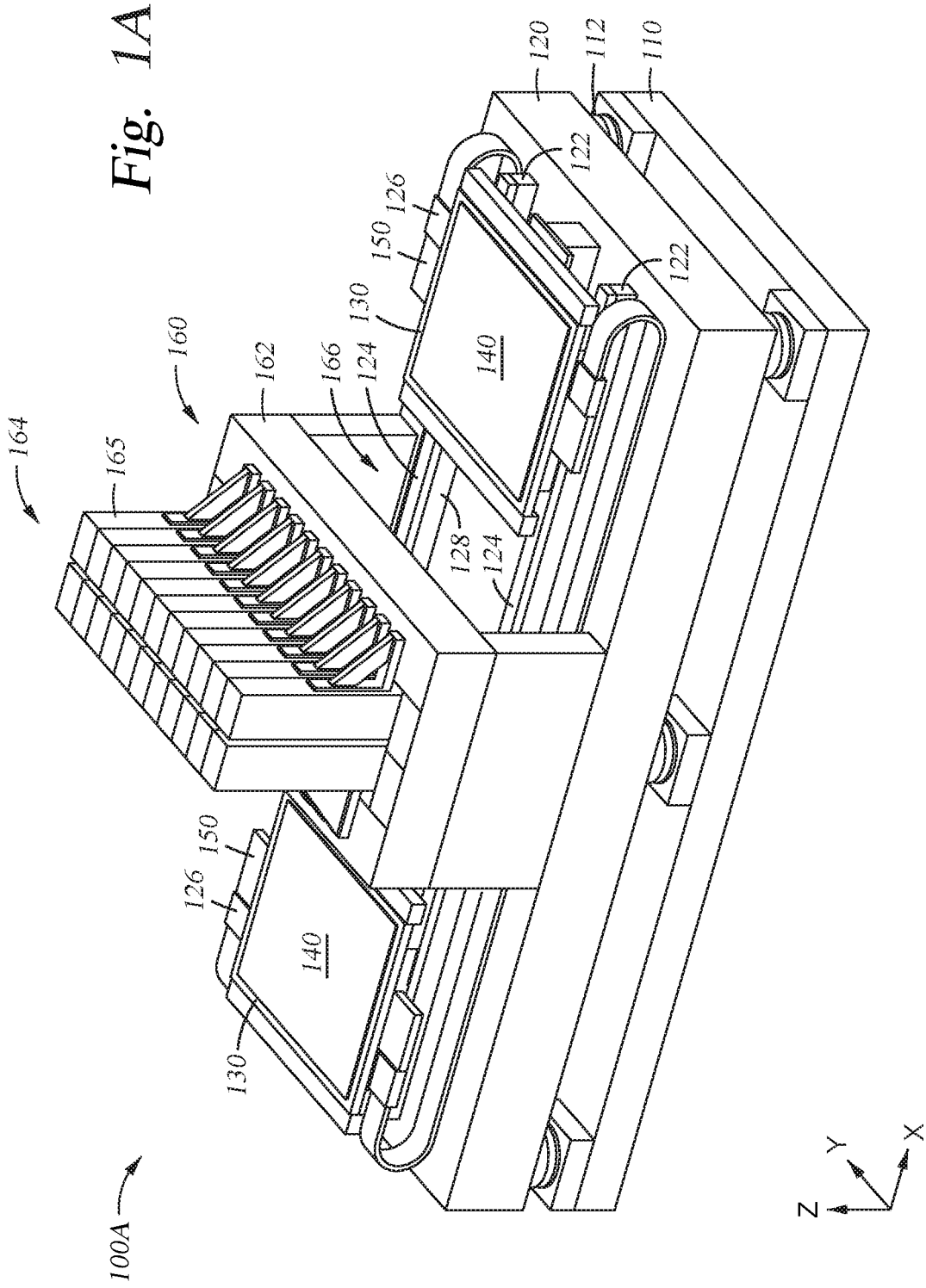
FIG. 1A is a perspective view of a system for maskless lithography having a digital micromirror device (DMD) that may benefit from embodiments disclosed herein.

FIG. 1A is a perspective view of a system 100A that may benefit from embodiments disclosed herein. The system 100A includes a base frame 110, a slab 120, two or more stages 130, and a processing apparatus 160. The base frame 110 may rest on the floor of a fabrication facility and may support the slab 120. Passive air isolators 112 may be positioned between the base frame 110 and the slab 120. The slab 120 may be a monolithic piece of granite, and the two or more stages 130 may be disposed on the slab 120. A substrate 140 may be supported by each of the two or more stages 130. A plurality of holes (not shown) may be formed in the stage 130 for allowing a plurality of lift pins (not shown) to extend therethrough. The lift pins may rise to an extended position to receive the substrate 140, such as from a transfer robot (not shown). The transfer robot may position the substrate 140 on the lift pins, and the lift pins may thereafter gently lower the substrate 140 onto the stage 130.

The substrate 140 may, for example, be made of quartz and be used as part of a flat panel display. In other embodiments, the substrate 140 may be made of other materials such as glass. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to a photoresist developer applied to the photoresist after the pattern is written into the photoresist. The chemical composition of the photoresist determines whether the photoresist will be a positive photoresist or negative photoresist. For example, the photoresist may include at least one of diazonaphthoquinone, a phenol formaldehyde resin, poly(methyl methacrylate), poly(methyl glutarimide), and SU-8. In this manner, the pattern may be created on a surface of the substrate 140 to form the electronic circuitry.

The system 100A may further include a pair of supports 122 and a pair of tracks 124. The pair of supports 122 may be disposed on the slab 120, and the slab 120 and the pair of supports 122 may be a single piece of material. The pair of tracks 124 may be supported by the pair of the supports 122, and the two or more stages 130 may move along the tracks 124 in the X-direction. In one embodiment, the pair of tracks 124 is a pair of parallel magnetic channels. As shown, each track 124 of the pair of tracks 124 is linear. In other embodiments, the track 124 may have a non-linear shape. An encoder 126 may be coupled to each stage 130 in order to provide location information to a controller 602 (Shown in FIG. 6).

The processing apparatus 160 may include a support 162 and a processing unit 164. The support 162 may be disposed on the slab 120 and may include an opening 166 for the two or more stages 130 to pass under the processing unit 164. The processing unit 164 may be supported by the support 162. In one embodiment, the processing unit 164 is a pattern generator configured to expose a photoresist in a photolithography process. In some embodiments, the pattern generator may be configured to perform a maskless lithography process. The processing unit 164 may include a plurality of image projection systems (shown in FIG. 3) disposed in a case 165. The processing apparatus 160 may be utilized to perform maskless direct patterning. During operation, one of the two or more stages 130 moves in the X-direction from a loading position, as shown in FIG. 1, to a processing position. The processing position may refer to one or more positions of the stage 130 as the stage 130 passes under the processing unit 164. During operation, the two or more stages 130 may be lifted by a plurality of air bearings 202 (shown in FIG. 2) and may move along the pair of tracks 124 from the loading position to the processing position. A plurality of vertical guide air bearings (not shown) may be coupled to each stage 130 and positioned adjacent an inner wall 128 of each support 122 in order to stabilize the movement of the stage 130. Each of the two or more stages 130 may also move in the Y-direction by moving along a track 150 for processing and/or indexing the substrate 140.

FIG. 1B is a perspective view of a photolithography system 100B for a single substrate according to embodiments disclosed herein. As the generations increase to larger substrates, floor space becomes a problem. The photolithography system 100B for the single substrate utilizes less floor space then system 100A described above with respect to FIG. 1A. The system 100B includes a base frame 110, a slab 120, a stage 130, and a processing apparatus 160. The base frame 110 rests on the floor of a fabrication facility and supports the slab 120. Passive air isolators 112 are positioned between the base frame 110 and the slab 120. In one embodiment, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material, for example, quartz used as part of a flat panel display. In other embodiments, the substrate 140 is made of other materials. In some embodiments, the substrate 140 has a photoresist layer formed thereon. A photoresist is sensitive to radiation. A positive photoresist includes portions of the photoresist, which when exposed to radiation, will be respectively soluble to photoresist developer applied to the photoresist after the pattern is written into the photoresist. A negative photoresist includes portions of the photoresist, which when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. In this manner, the pattern is created on a surface of the substrate 140 to form the electronic circuitry.

The system 100B includes a pair of supports 122 and a pair of tracks 124. The pair of supports 122 are disposed on the slab 120, and the slab 120 and the pair of supports 122 are a single piece of material. The pair of tracks 124 are supported by the pair of the supports 122, and the stage 130 moves along the tracks 124 in the X-direction. In one embodiment, the pair of tracks 124 is a pair of parallel magnetic channels. As shown, each track 124 of the pair of tracks 124 is linear. In other embodiments, one or more track 124 is non-linear. An encoder 126 is coupled to the stage 130 in order to provide location information to a controller (not shown).

The processing apparatus 160 includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatus (shown in FIG. 3). In one embodiment, the processing unit 164 contains as many as 84 image projection apparatus. Each image projection apparatus is disposed in a case 165. The processing apparatus 160 is useful to perform maskless direct patterning.

During operation, the stage 130 moves in the X-direction from a loading position, as shown in FIG. 1, to a processing position. The processing position is one or more positions of the stage 130 as the stage 130 passes under the processing unit 164. During operation, the stage 130 is be lifted by a plurality of air bearings (not shown) and moves along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

A metrology system measures the X and Y lateral position coordinates of each of the stage 130 in real time so that each of the plurality of image projection apparatus can accurately locate the patterns being written in a photoresist covered substrate. The metrology system also provides a real-time measurement of the angular position of each of the stage 130 about the vertical or Z-axis. The angular position measurement can be used to hold the angular position constant during scanning by means of a servo mechanism or it can be used to apply corrections to the positions of the patterns being written on the substrate 140 by the image projection apparatus 301, shown in FIG. 3. These techniques may be used in combination.

FIG. 2 is a cross-sectional side view of the system 100A of FIG. 1A according to one embodiment. As shown, each stage 130 includes a plurality of air bearings 202 for lifting the stage 130. Each stage 130 may also include a motor coil (not shown) for moving the stage 130 along the tracks 124. The two or more stages 130 and the processing apparatus 160 may be enclosed by an enclosure (not shown) in order to provide temperature and pressure control.

Figure 3:
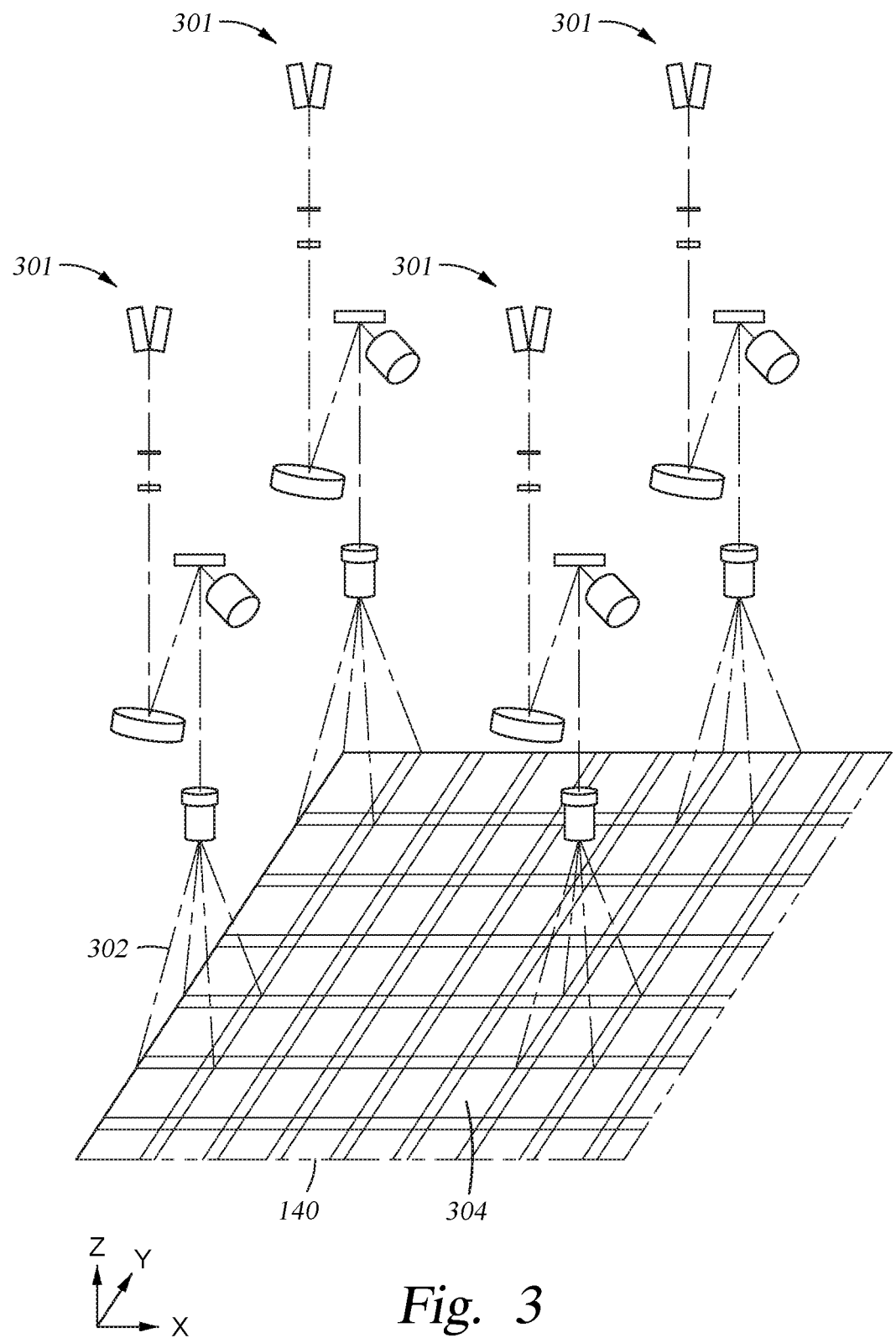
FIG. 3 is a perspective schematic view of a plurality of image projection systems in the DMD according to one embodiment.

FIG. 3 is a perspective schematic view of a plurality of image projection systems 301 according to one embodiment. As shown in FIG. 3, each image projection system 301 produces a plurality of write beams 302 that are directed onto a surface 304 of the substrate 140. As the substrate 140 moves in the X-direction and Y-direction, the entire surface 304 may be patterned by the write beams 302. The number of the image projection systems 301 may vary based on the size of the substrate 140 and/or the speed of stage 130. In one embodiment, there are 22 image projection systems 301 in the processing apparatus 160.

Figure 4:
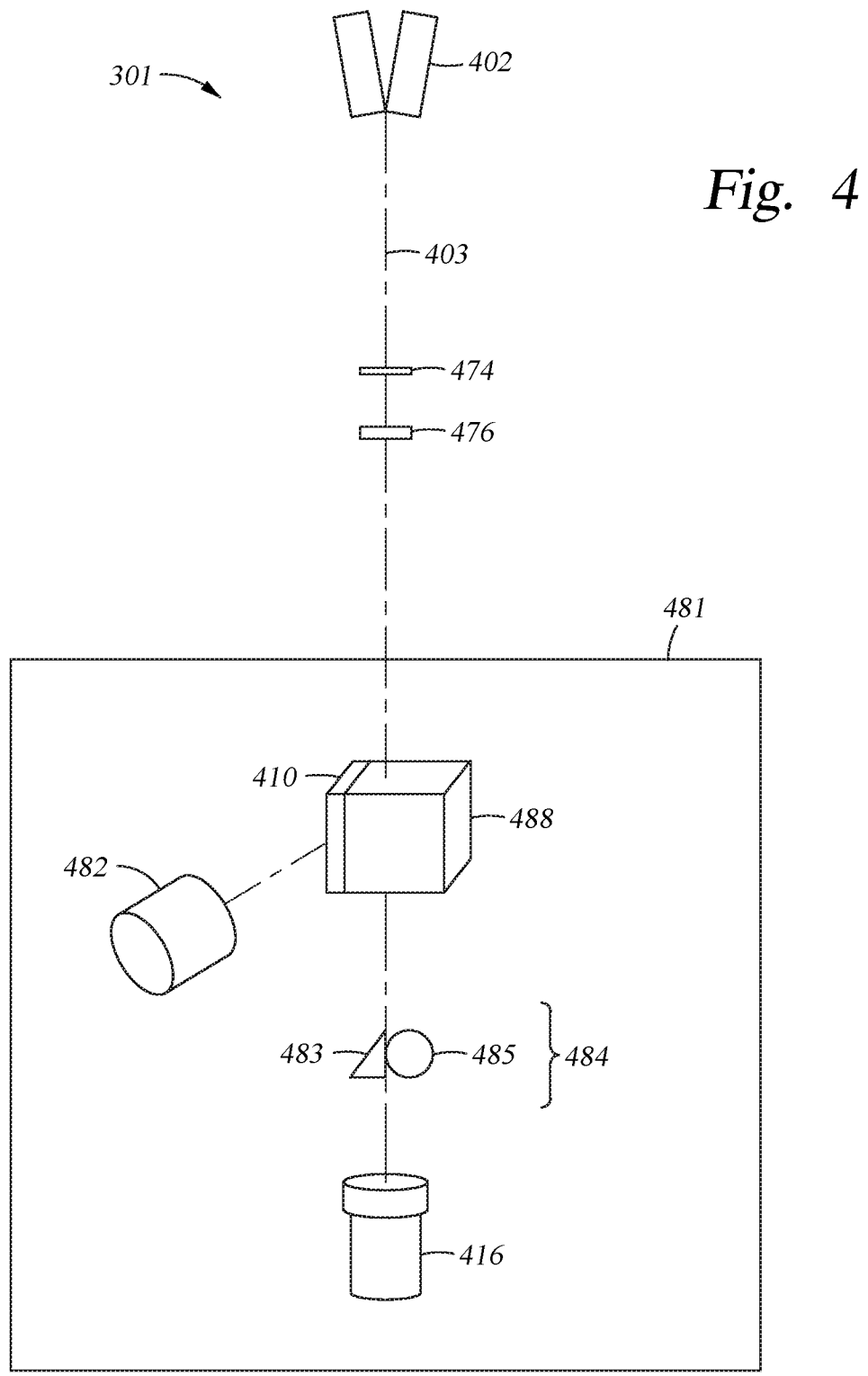
FIG. 4 is a perspective schematic view of an image projection apparatus of the plurality of image projection devices of FIG. 3 according to one embodiment.

FIG. 4 is a perspective schematic view of an image projection apparatus 481 of the plurality of image projection devices of FIG. 3 according to one embodiment. In the embodiment shown, the image projection apparatus 481 uses one or more DMDs 410 as the spatial light modulator (s). The image projection apparatus 481 is part of an image projection system 301, which includes a light source 402, an aperture 474, a lens 476, a frustrated prism assembly 488, one or more DMDs 410 (one is shown), and a light dump 482, in addition to the alignment and inspection system 484 and the projection lens 416. The light source 402 is any suitable light source, such as a light emitting diode (LED) or a laser, capable of producing a light having predetermined wavelength. In one embodiment, the predetermined wavelength is in the blue or near ultraviolet (UV) range, such as less than about 450 nm. The frustrated prism assembly 488 includes a plurality of reflective surfaces. The projection lens 416 is, as an example, a 10× objective lens. During operation of the image projection apparatus 481, a light beam 403 having a predetermined wavelength, such as a wavelength in the blue range, is produced by the light source 402. The light beam 403 is reflected to the DMD 410 by the frustrated prism assembly 488. The DMD 410 includes a plurality of mirrors, and the number of mirrors corresponds to the number of pixels to be projected. The plurality of mirrors are individually controllable, and each mirror of the plurality of mirrors is at an "on" position or "off" position, based on the mask data provided to the DMD 410 by the controller (not shown). When the light beam 403 reaches the mirrors of the DMD 289, the mirrors that are at "on" position reflect the light beam 403, i.e., forming the plurality of write beams, to the projection lens 416. The projection lens 416 then projects the write beams to the surface of the substrate. The mirrors that are at "off" position reflect the light beam 403 to the light dump 482 instead of the surface of the substrate.

Figure 5:
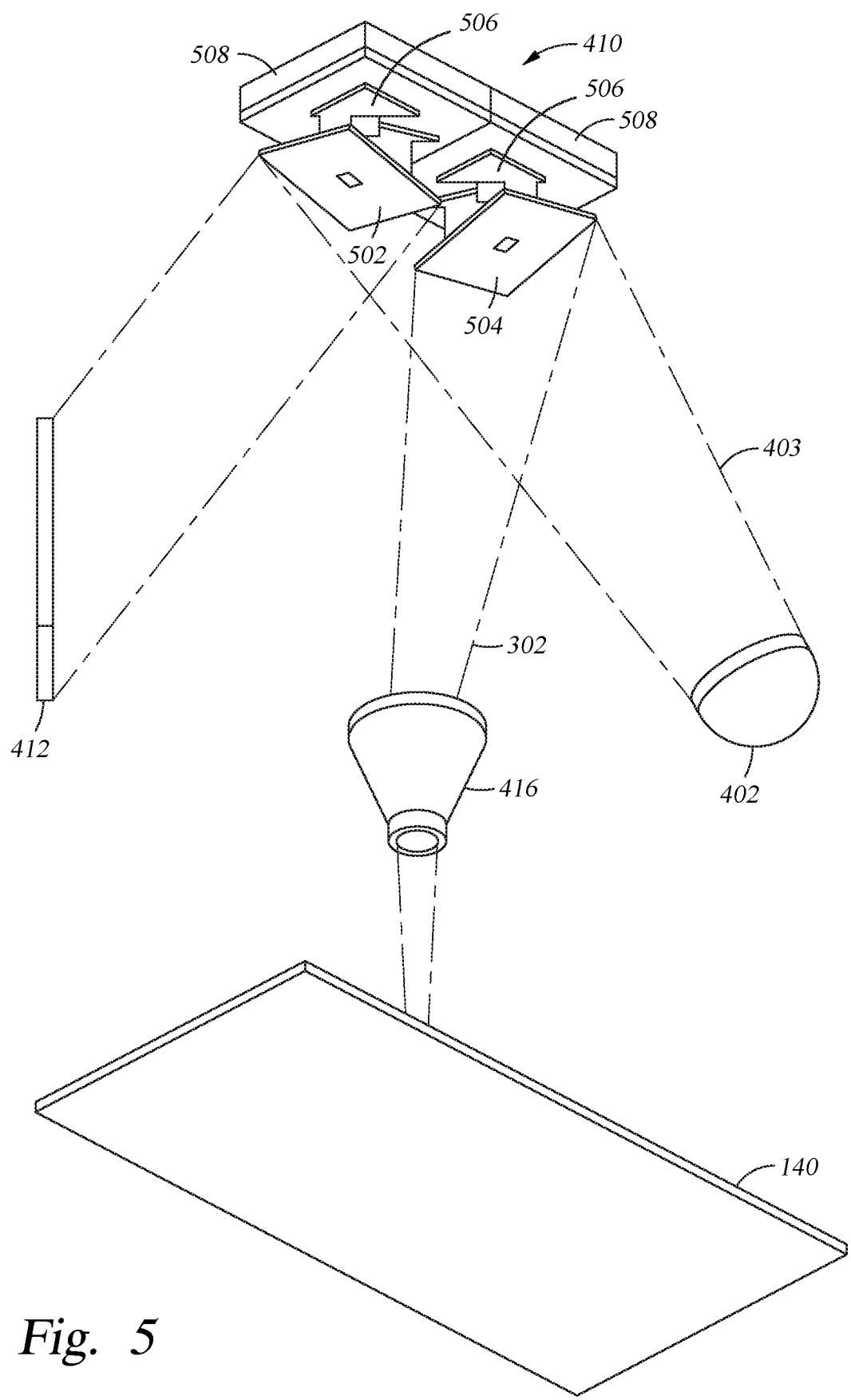
FIG. 5 schematically illustrates a beam being reflected by two mirrors of the DMD according to one embodiment.

FIG. 5 illustrates two mirrors 502, 504 of the DMD 410 according to one embodiment. As shown, each mirror 502, 504 of the DMD 410 is disposed on a tilting mechanism 506, which is disposed on a memory cell 508. The memory cell 508 may be a CMOS SRAM. During operation, each mirror 502, 504 is controlled by loading the mask data into the memory cell. The mask data electrostatically controls the tilting of the mirror 502, 504 in a binary fashion. When the mirror 502, 504 is in a reset mode or without power applied, it may be set to a flat position, not corresponding to any binary number. Zero in binary may correspond to an "off" position, which means the mirror is tilted at −10 degrees, −12 degrees, or any other feasibly negative tilting degree. One in binary may correspond to an "on" position, which means the mirror is tilted at +10 degrees, +12 degrees, or any other feasibly positive tilting degree. As shown in FIG. 5, the mirror 502 is at "off" position and the mirror 504 is at "on" position.

The beam 403 may be reflected by the two mirrors 502, 504 of the DMD 410, according to one embodiment. As shown, the mirror 502, which is at "off" position, reflects the beam 403 generated from the light source 402 to the light dump 412. The mirror 504, which is at "on" position, forms the write beam 302 by reflecting the beam 403 to the projection lens 416.

Figure 6:
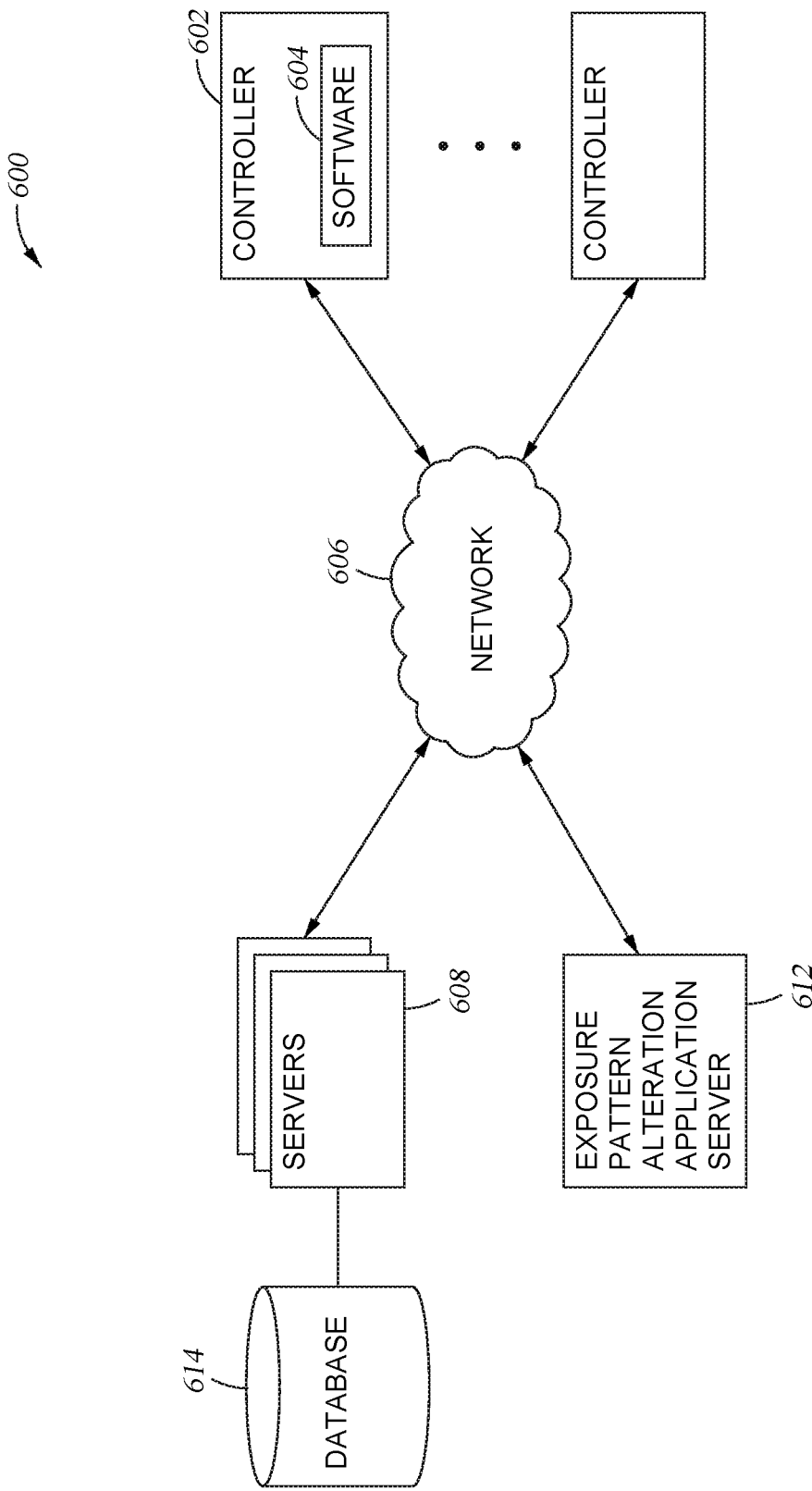
FIG. 6 illustrates a computer system configured for enhancing maskless lithography pattern resolution on a substrate.

FIG. 6 illustrates a computer system configured for enhancing maskless lithography pattern resolution on a substrate in which embodiments of the disclosure may be practiced. As shown, the computing system 600 may include a plurality of servers 608, a pattern resolution enhancement application (PREA) server 612, and a plurality of controllers (i.e., computers, personal computers, mobile/wireless devices) 602 (only two of which are shown for clarity), each connected to a communications network 606 (for example, the Internet). The servers 608 may communicate with the database 614 via a local connection (for example, a Storage Area Network (SAN) or Network Attached Storage (NAS)) or over the Internet. The servers 608 are configured to either directly access data included in the database 614 or to interface with a database manager that is configured to manage data included within the database 614.

The controller 602 is generally designed to facilitate the control and automation of the processing techniques described herein. The controller 602 may be coupled to or in communication with one or more of the processing apparatus 160, the stages 130, and the encoder 126. The processing apparatus 160 and the stages 130 may provide information to the controller 602 regarding the substrate processing and the substrate aligning. For example, the processing apparatus 160 may provide information to the controller 602 to alert the controller that substrate processing has been completed. The encoder 126 may provide location information to the controller 602, and the location information is then used to control the stages 130 and the processing apparatus 160.

Each controller 602 may include conventional components of a computing device, for example, a processor, system memory, a hard disk drive, a battery, input devices such as a mouse and a keyboard, and/or output devices such as a monitor or graphical user interface, and/or a combination input/output device such as a touchscreen which not only receives input but also displays output. Each server 608 and the PREA server 612 may include a processor and a system memory (not shown), and may be configured to manage content stored in database 614 using, for example, relational database software and/or a file system. The servers 608 may be programmed to communicate with one another, the controllers 602, and the PREA server 612 using a network protocol such as, for example, the TCP/IP protocol. The PREA server 612 may communicate directly with the controllers 602 through the communications network 606. The controllers 602 are programmed to execute software 604, such as programs and/or other software applications, and access applications managed by servers 608.

In the embodiments described below, users may respectively operate the controllers 602 that may be connected to the servers 608 over the communications network 606. Pages, images, data, documents, and the like may be displayed to a user via the controllers 602. Information and images may be displayed through a display device and/or a graphical user interface in communication with the controller 602.

It is noted that the controller 602 may be a personal computer, laptop mobile computing device, smart phone, video game console, home digital media player, network-connected television, set top box, and/or other computing devices having components suitable for communicating with the communications network 606 and/or the required applications or software. The controller 602 may also execute other software applications configured to receive content and information from the PREA server 612.

Figure 7:
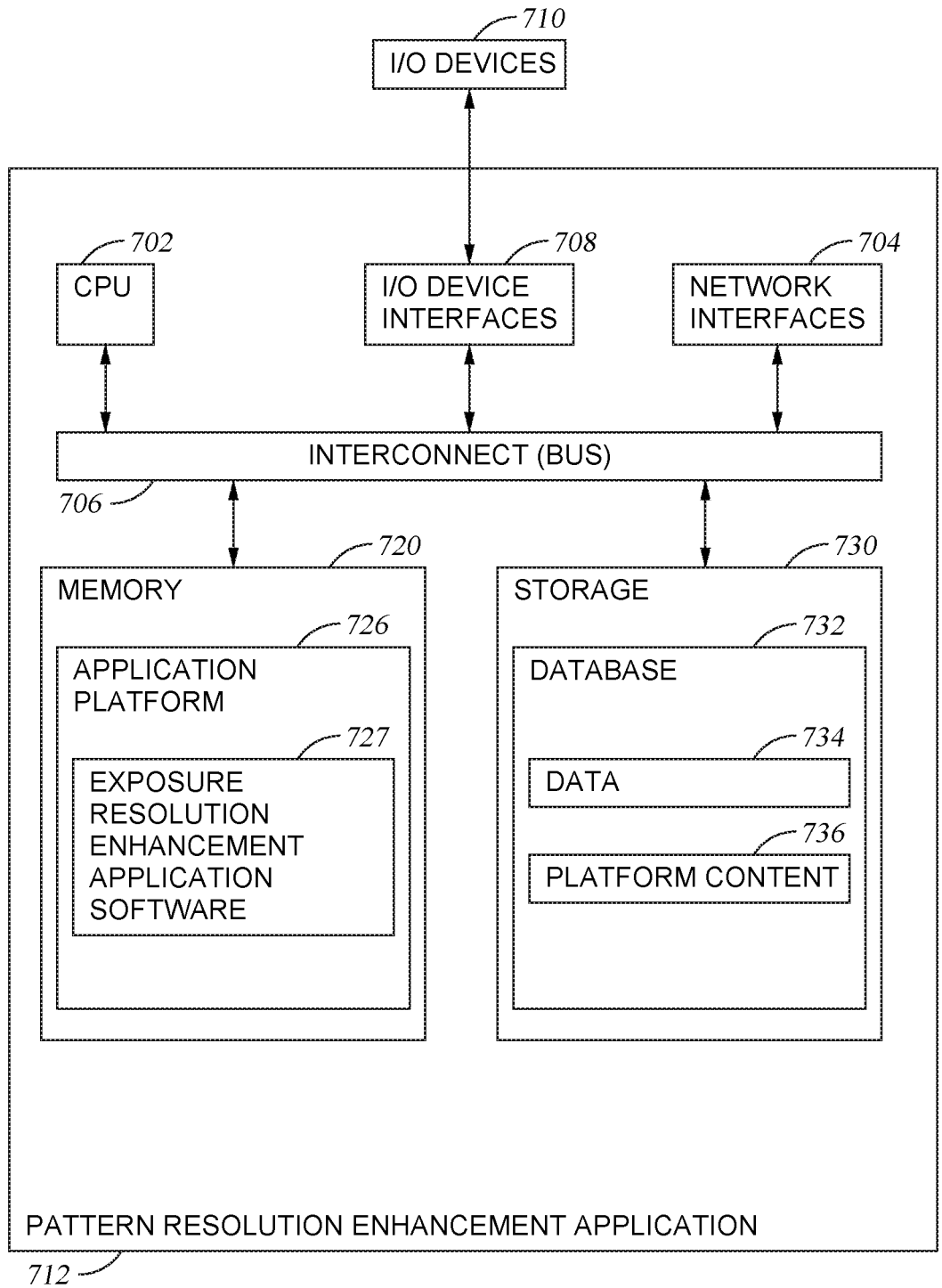
FIG. 7 illustrates a more detailed view of a server of FIG. 6 according to one embodiment.

FIG. 7 illustrates a more detailed view of the PREA server 612 of FIG. 6. The PREA server 612 includes, without limitation, a central processing unit (CPU) 702, a network interface 704, memory 720, and storage 730 communicating via an interconnect 706. The PREA server 612 may also include I/O device interfaces 708 connecting I/O devices 710 (for example, keyboard, video, mouse, audio, touchscreen, etc.). The PREA server 612 may further include the network interface 804 configured to transmit data via the communications network 606.

The CPU 702 retrieves and executes programming instructions stored in the memory 720 and generally controls and coordinates operations of other system components. Similarly, the CPU 702 stores and retrieves application data residing in the memory 720. The CPU 702 is included to be representative of a single CPU, multiple CPU's, a single CPU having multiple processing cores, and the like. The interconnect 706 is used to transmit programming instructions and application data between the CPU 702, I/O device interfaces 708, storage 730, network interface 704, and memory 720.

The memory 720 is generally included to be representative of a random access memory and, in operation, stores software applications and data for use by the CPU 702. Although shown as a single unit, the storage 730 may be a combination of fixed and/or removable storage devices, such as fixed disk drives, floppy disk drives, hard disk drives, flash memory storage drives, tape drives, removable memory cards, CD-ROM, DVD-ROM, Blu-Ray, HD-DVD, optical storage, network attached storage (NAS), cloud storage, or a storage area-network (SAN) configured to store non-volatile data.

The memory 720 may store instructions and logic for executing an application platform 726 which may include pattern resolution enhancement application software 728. The storage 730 may include a database 732 configured to store data 734 and associated application platform content 736. The database 732 may be any type of storage device.

Network computers are another type of computer system that can be used in conjunction with the disclosures provided herein. Network computers do not usually include a hard disk or other mass storage, and the executable programs are loaded from a network connection into the memory 720 for execution by the CPU 702. A typical computer system will usually include at least a processor, memory, and an interconnect coupling the memory to the processor.

Figure 8:
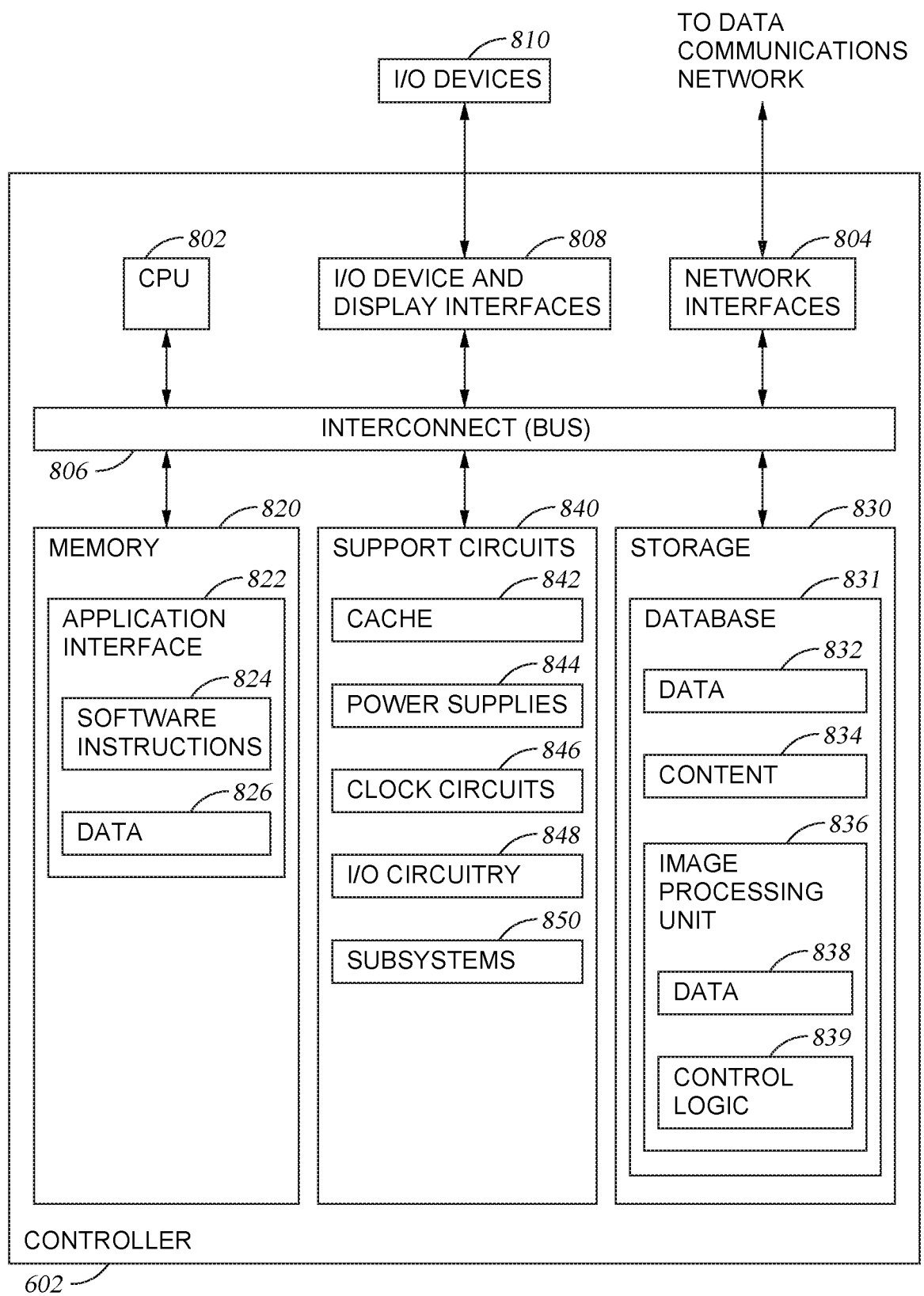
FIG. 8 illustrates a controller computing system used to access a maskless lithography resolution enhancing application according to one embodiment.

FIG. 8 illustrates a controller 602 used to access the PREA server 612 and retrieve or display data associated with the application platform 726. The controller 602 may include, without limitation, a central processing unit (CPU) 802, a network interface 804, an interconnect 806, a memory 820, storage 830, and support circuits 840. The controller 602 may also include an I/O device interface 808 connecting I/O devices 810 (for example, keyboard, display, touchscreen, and mouse devices) to the controller 602.

Like CPU 702, CPU 802 is included to be representative of a single CPU, multiple CPU's, a single CPU having multiple processing cores, etc., and the memory 820 is generally included to be representative of a random access memory. The interconnect 806 may be used to transmit programming instructions and application data between the CPU 802, I/O device interface 808, storage 830, network interface 804, and memory 820. The CPU 802 may be one of any form of computer processors that are used in industrial settings for controlling various processes and hardware (e.g., pattern generators, motors, and other hardware) and monitor the processes (e.g., processing time and substrate position).

The network interface 804 may be configured to transmit data via the communications network 606, for example, to transfer content from the PREA server 612. Storage 830, such as a hard disk drive or solid-state storage drive (SSD), may store non-volatile data. The storage 830 may contain a database 831. The database 831 may contain data 832, other content 834, and an image process unit 836 having data 838 and control logic 839.

The memory 820 is connected to the CPU 802, and may be one or more of a readily available memory, such as random access memory (RAM), read only memory (ROM), floppy disk, hard disk, or any other form of digital storage, local or remote. Software instructions and data can be coded and stored within the memory for instructing the CPU 802. The memory 820 may include an application interface 822, which itself may display software instructions 824, and/or store or display data 826. The application interface 822 may provide one or more software applications which allow the controller to access data and other content hosted by the PREA server 612.

The support circuits 840 connected to the CPU 802 for supporting the processor may include conventional cache 842, power supplies 844, clock circuits 846, input/output circuitry 848, subsystems 850, and the like. A program (or computer instructions) readable by the controller 602 determines which tasks are performable on a substrate. The program may be software readable by the controller 602 and may include code to monitor and control, for example, the processing time and substrate position.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present example also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, read-only memories (ROMs), random access memories (RAMs), EPROMs, EEPROMs, flash memory, magnetic or optical cards, any type of disk including floppy disks, optical disks, CD-ROMs, and magnetic-optical disks, or any type of media suitable for storing electronic instructions, and each coupled to a computer system interconnect.

The algorithms and displays presented herein are not inherently related to any particular computer or other apparatus. Various general purpose systems may be used with programs in accordance with the teachings herein, or it may prove convenient to construct a more specialized apparatus to perform the required method operations. The structure for a variety of these systems will appear from the description above. In addition, the present examples are not described with reference to any particular programming language, and various examples may thus be implemented using a variety of programming languages.

Figure 9:
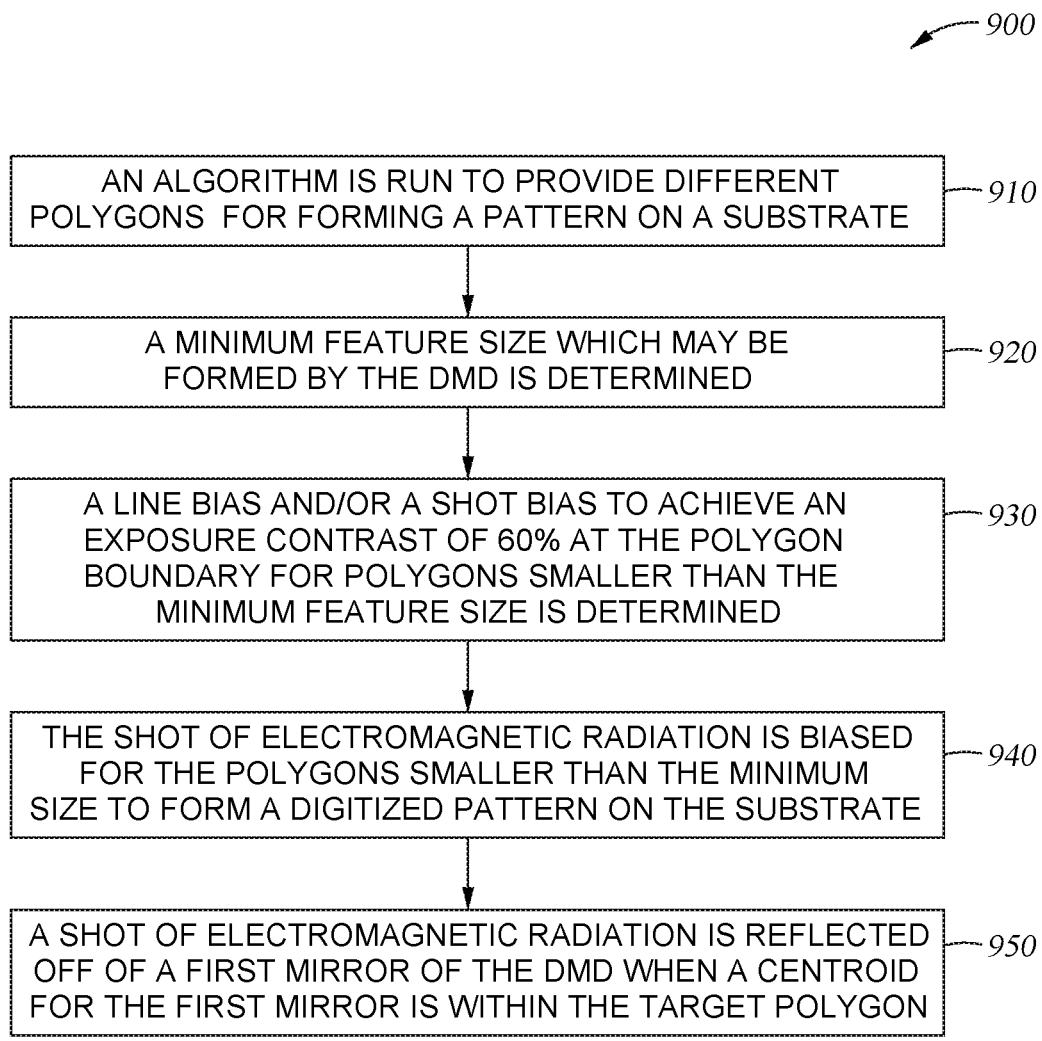
FIG. 9 illustrates a method to enhance the resolution of maskless lithography while maintaining a high image contrast.

The embodiments described herein relate to a software application platform, which enables the development of skinnier lines, i.e., smaller feature sizes, than the mirror size allows for a given mirror size when forming a lithography pattern on a substrate. FIG. 9 illustrates a method 900 to enhance the resolution of maskless lithography while maintaining a high image contrast. The method may be performed by the controller 602, as shown in FIG. 8 or other suitable device. The method 900 begins at block 910. At block 910, an algorithm is run to provide different polygons for forming a pattern on a substrate. A computer generated pattern, i.e., polygons, provides boundary conditions for exposing photo-resist thereon a substrate. The pattern of polygons may generate lines between about 0.01 μm to about 50 μm, such as about 3.0 μm, to be exposed in the photo lithography process.

At block 920, a minimum feature size which may be formed by the DMD is determined. As discussed above, the feature size limitation is a function of the DMD mirror size and the hardware lens. The hardware configuration of the DMD dictates the minimum standard feature which can be printed. For example, the DMD may be suitable for exposing at a resolution of about 5 um. If there are 4 um features to be exposed, then the method which follows provides for the DMD to form the smaller features without any hardware changes. If a standard recipe is to deposit 100 shots worth of light in all of our target polygons, a feature that is smaller than our 5 um min feature size would receive less than 100 shots and would be under-exposed. Instead, the feature can be properly exposed through either a line bias or a multiplicity bias (shot bias) or both. For example, the number of shots may be increased by 100%. Biasing will be further explained using FIGS. 10A through 13B.

At block 930, a line bias and/or a shot bias is determined to achieve a predetermined acceptable exposure contrast at the polygon boundary for polygons smaller than the minimum feature size. This results in the formation of the features on the substrate where a contrast of between about 40% and about 80%, such as about 60% or greater is provided, i.e., where light energy has been directed on to the layer of material (photoresist) on the substrate in sufficient quantity to properly expose a feature. That is, each DMD exposes its own native resolution limit at a predetermined minimum contrast, such as about 60%, wherein the contrast is a measure of $(Imax-Imin)/(Imax+Imin)$. However, it should be appreciated that a number of variables may affect the minimum contrast interval such that a contrast of less than 60%, or more than 60%, may be adequate for exposure to form the desired feature. However, for ease of understanding the methods described herein, the remaining examples of exposure contrast will use a minimum contrast of about 60%.

An exposure contrast can be increased by increasing the number of shots in the target polygon as well as increasing the width of the target polygon (line bias). The minimum feature boundary is established at the 60% contrast interval, i.e., the areas having a contrast of less than 60% is not adequately exposed to produce the feature. A 0.8 um sub-resolution can be achieved by increasing the number of energy shots, i.e., multiplicity bias, in the target polygon and/or by line bias thinning the exposed polygon, i.e., making the target polygon width smaller, allowing smaller features to be produced than possible under native resolution techniques. For example, by increasing the number of exposure shots to 320 from 106 and applying a 0.33 line bias, the line resolution can be decreased from 1.5 μm to about 0.7 μm allowing for smaller features than possible under native resolution techniques.

At block 940, the electromagnetic radiation shot or the polygon lines are biased for the polygons smaller than the minimum feature size for forming a digitized pattern on the substrate when exposing a photo-resist. The target polygons are biased prior to firing any shots of light. This requires no shot biasing. However, line biasing may also require shot biasing. Exposing the photoresist on the substrate is used to form a pattern, i.e., features, on the substrate.

At block 950, a shot of electromagnetic radiation is reflected off of a first mirror of the DMD when a centroid for the first mirror is within the polygons in the pattern. The electromagnetic radiation may be in the form of light from a laser, such as a blue light laser, reflected off of the DMD mirrors. Each DMD mirror can be turned on or off, when reflecting a digitized pattern to ensure only electromagnetic radiation from the desired mirrors are directed to the target polygon and the areas outside the target polygon do not collect any residual electromagnetic radiation. In one embodiment the image projection system 301 may produce the electromagnetic radiation. The electromagnetic radiation may be visible light, for example, blue laser light emitted from the image projection system 301 and reflected off of the DMD 410.

As exposure points accumulate in an area of the target, a uniform aerial image is formed in the photoresist on the target. Based on the resolution of the DMD, step size, the number of columns shaved, and the number of exposure shots, the fidelity of the exposed line for the feature polygons can vary widely. As the width of the exposed polygons decreases, the image contrast begins to decrease. Line and/or multiplicity biasing is used to obtain the minimum 60% contrast at the line edge of the target polygon, for forming the critical dimensions of the features below the native resolution of the DMD on the substrate.

Figure 10A:
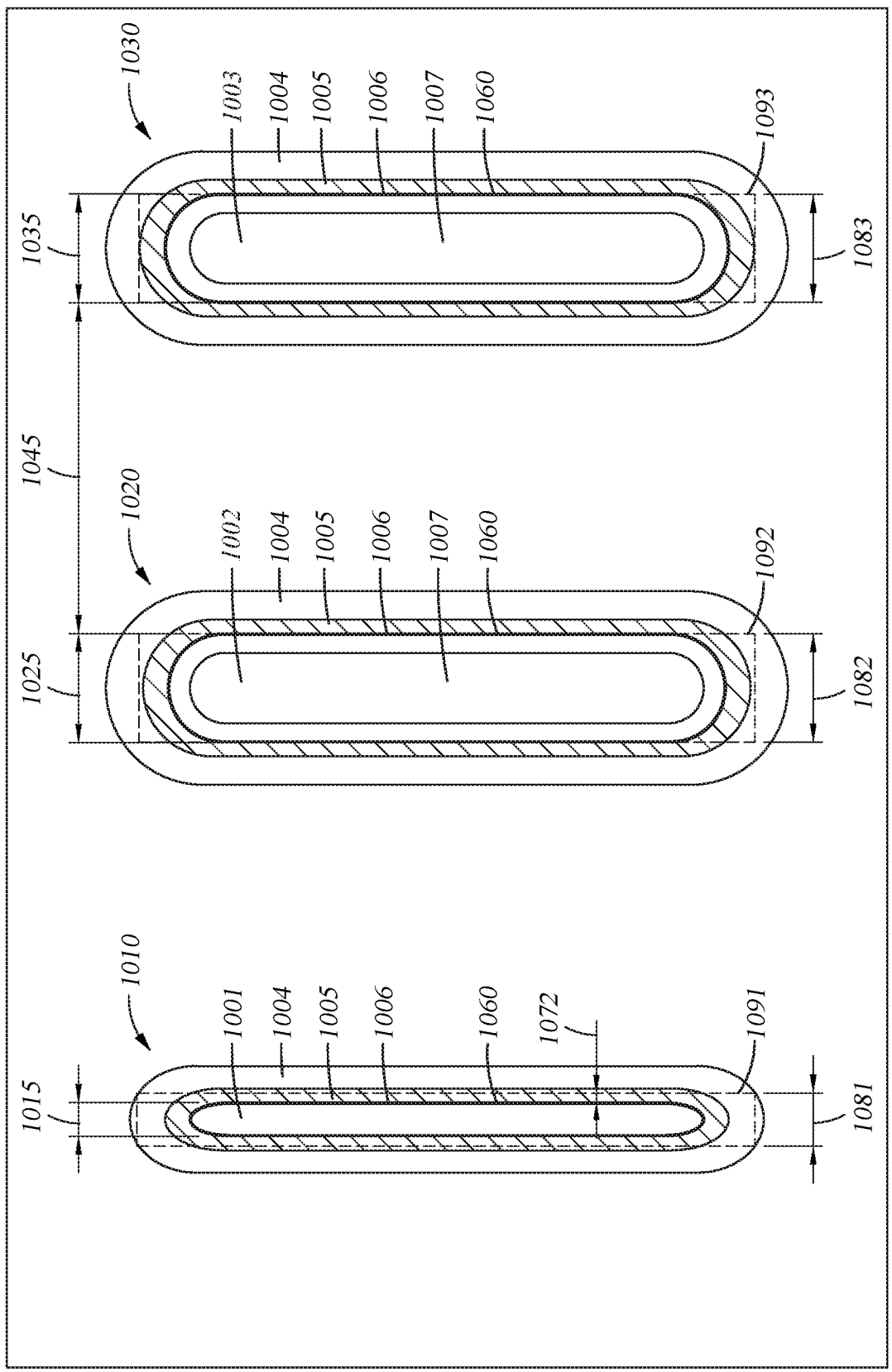
FIG. 10A-10B illustrates a first scheme for enhancing lithography pattern resolution using no line bias or multiplicity bias.
Figure 10B:
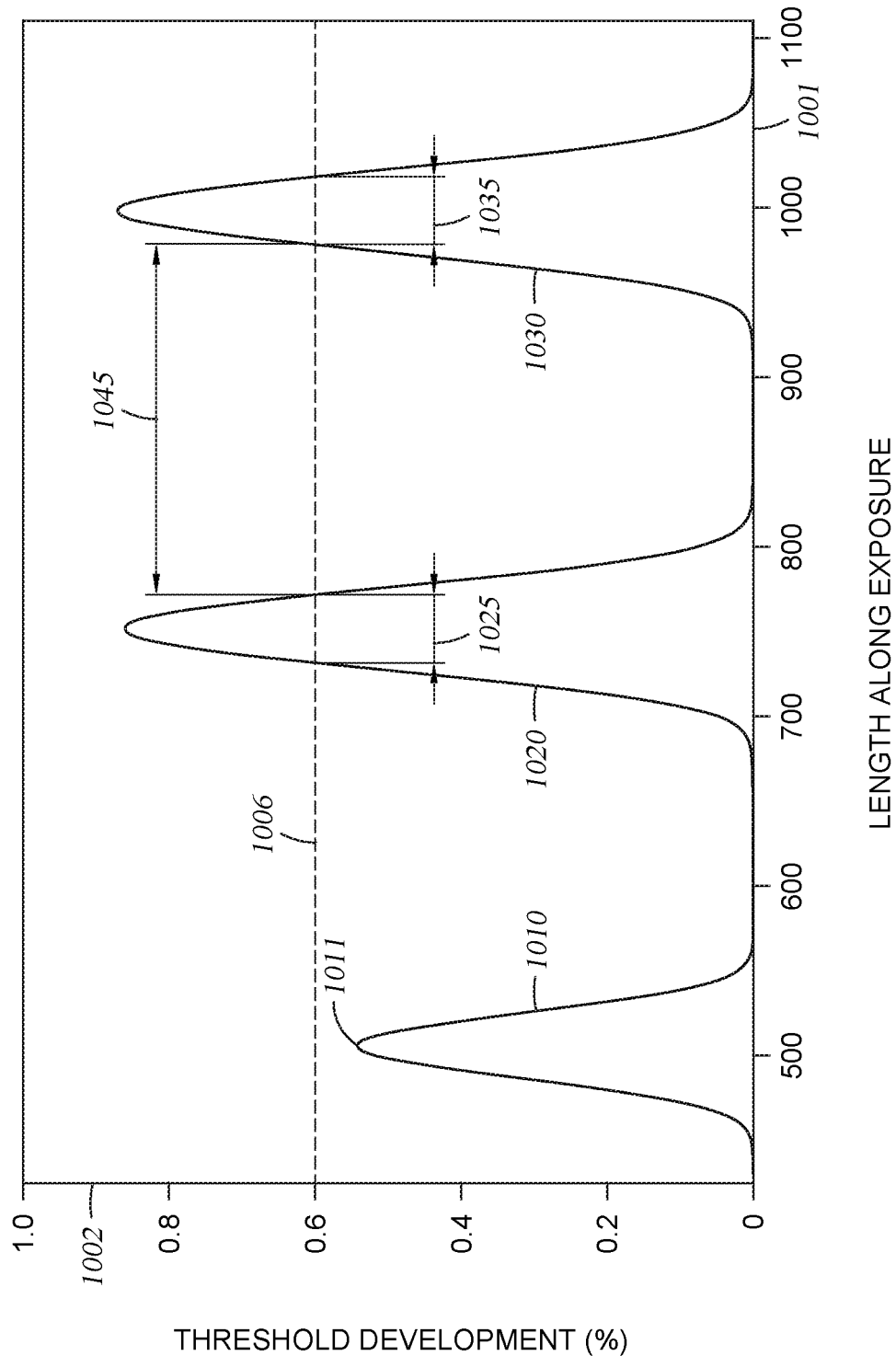

A discussion of the effect of no line or multiplicity (shot) biasing is provided here with respect to FIGS. 10A and 10B together. The study illustrates a first feature 1010, a second feature 1020 and a third feature 1030. The first feature 1010 has a first target polygon 1091 having a design width of 0.5 um. The second feature 1020 has a second target polygon 1092 having a design width of 1.0 um. The third feature 1030 has a third target polygon 1093 having a design width of 1.0 um. A pitch 1045 between the third target polygon 1093 and the second target polygon 1092 is an area where the exposure is ideally zero but should be less than 60% contrast to prevent the formation of features in this area.

As the width of the exposed polygons decreases, the image contrast begins to decrease once the target polygon size is less than the minimum feature that can be resolved by the system. The first feature 1010 has an exposed polygon 1001 having a first width 1015 of about 0.29 um. The exposed polygon 1001 has a contrast greater than 60%. The contrast intervals shown are a 60% interval 1060, a 50% interval 1005 and a 40% interval 1004. As can be seen, the first width 1015 of the exposed polygon 1001 is a distance 1072 smaller than a first target width 1081 of the first target polygon 1091. The distance 1072 is about (0.5 um-0.29 um)/2, i.e., 0.105 um short for a single side of the feature design. As shown in the length along exposure (FIG. 10B), the threshold development 1011 is less than 60%, i.e., about 54%, and thus complete formation of the first feature 1010 is not obtained.

The second feature 1020 has a second exposed polygon 1002 having a second width 1025 of about 0.97 um. The second exposed polygon 1002 resides in the area of the second feature 1020 having a contrast greater than 60%. The second width 1025 of the second exposed polygon 1002 is substantially similar to a second target width 1082 of the second target polygon 1092. As shown in the length along exposure (FIG. 10B) the threshold development is greater than 60% and less than %100, such as about 86%. Thus complete formation of the second feature 1020 is obtained.

The third feature 1030 has a third exposed polygon 1003 having a third width 1035 of about 0.97 um. The third feature 1030 is substantially similar to the second feature 1020 and has similar results in forming the feature.

Figure 11A:
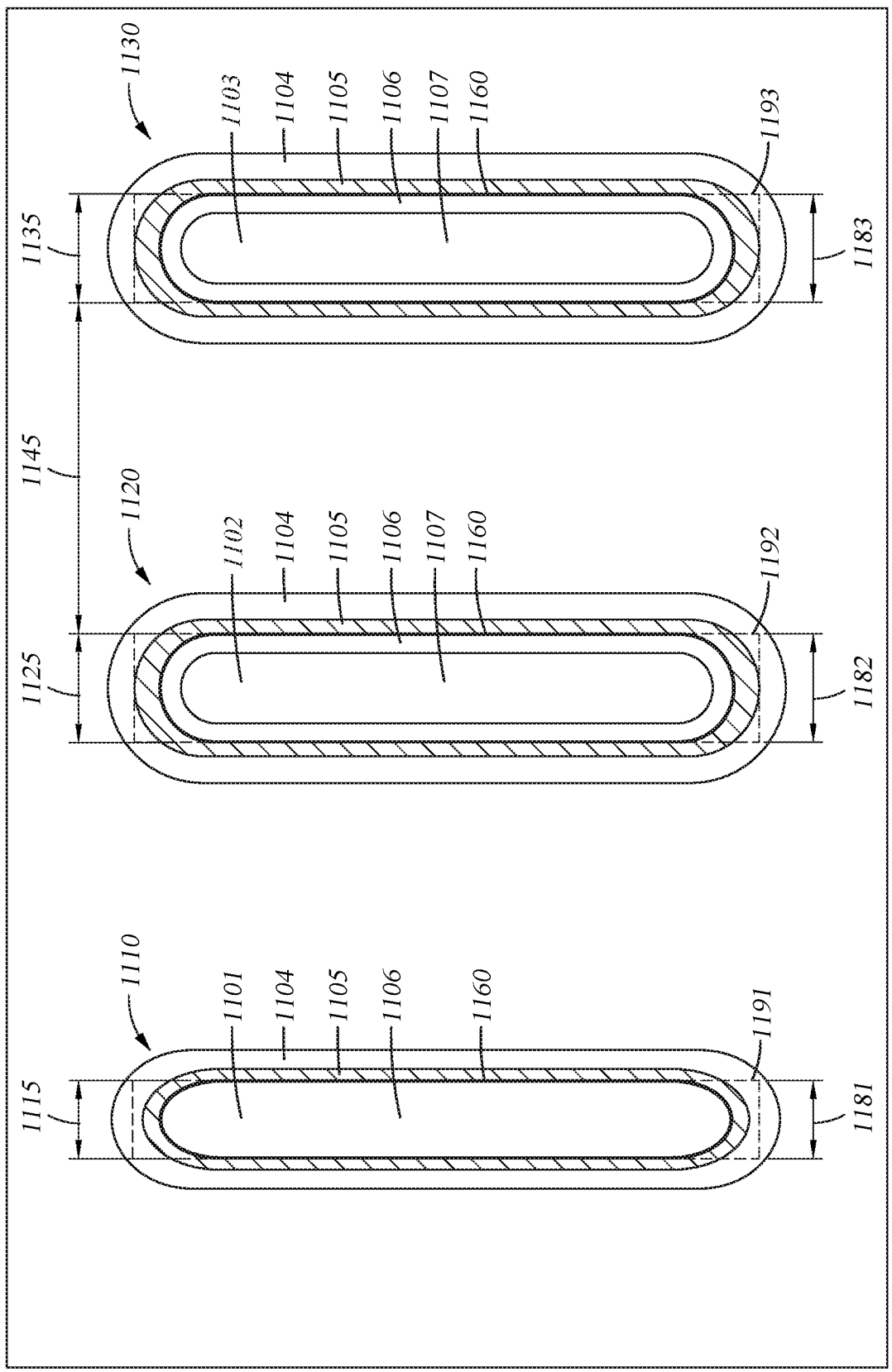
FIG. 11A-11B illustrates a second scheme for enhancing lithography pattern resolution using line bias but no multiplicity bias.
Figure 11B:
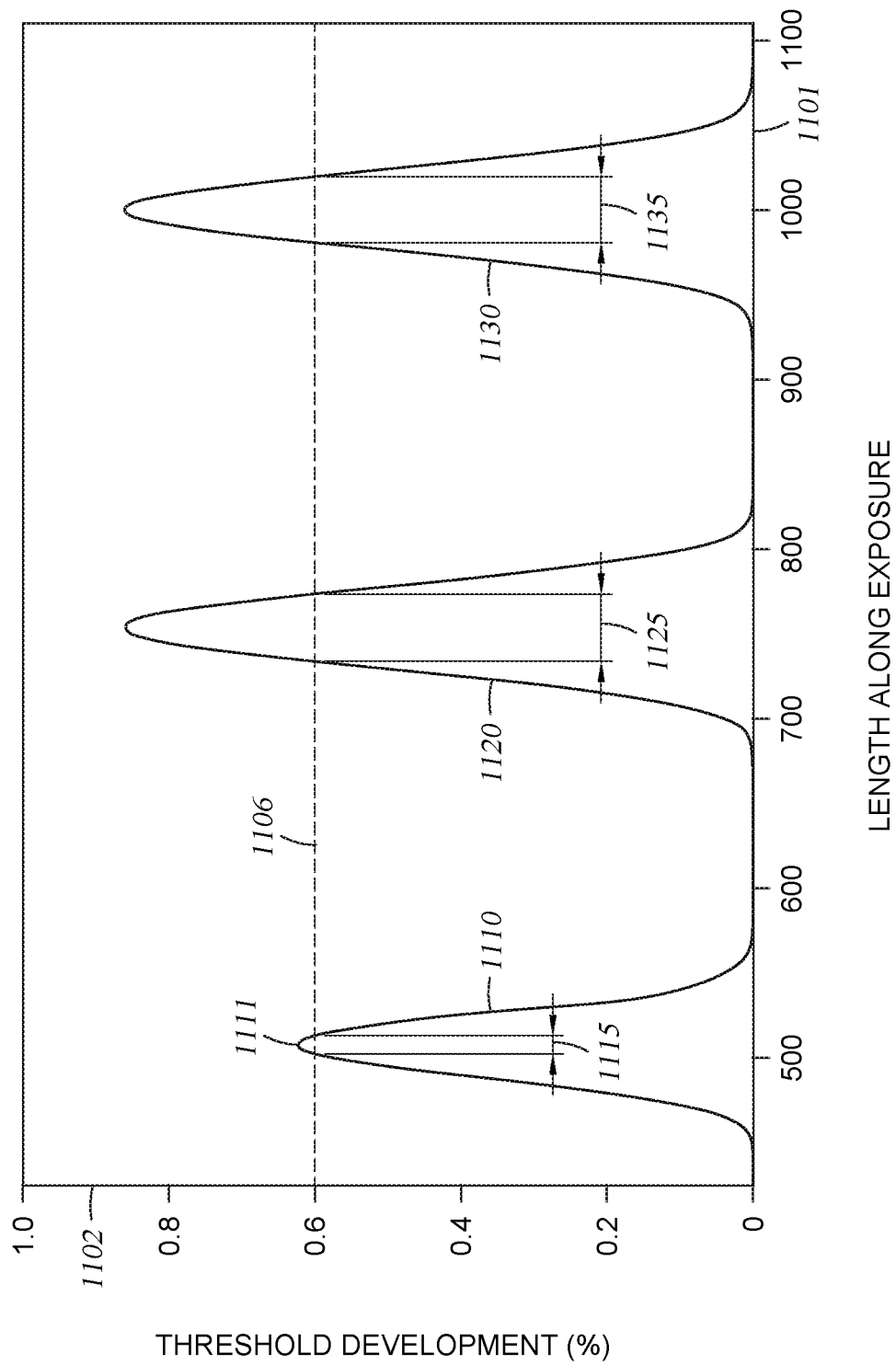

FIGS. 11A and 11B illustrates a study of the effects of line biasing without multiplicity biasing. That is, increasing or decreasing the design width of a feature to achieve a different dimension during processing. The study illustrates a first feature 1110, a second feature 1120 and a third feature 1130 formation on a substrate. The first feature 1110 has a first target polygon 1191 having a design width of 0.5 which is biased to 0.62 um. The second feature 1120 has a second target polygon 1192 having a design width of 1.0 um. The third feature 1130 has a third target polygon 1193 having a design width of 1.0 um. A pitch 1145 is shown between the third target polygon 1193 and the second target polygon 1192 having no formation of features therein.

The first feature 1110 has an exposed polygon 1101 having a first width 1115 of about 0.51 um. The exposed polygon 1101 has a contrast greater than 60%. The contrast intervals shown are a 60% interval 1160, a 50% interval 1105 and a 40% interval 1104. The first width 1115 of the exposed polygon 1101 is substantially the same as a first target width 1181 of the first target polygon 1191. The length along exposure (FIG. 11B) shows a threshold development 1111 greater than 60%, such as about 62.3%, and thus complete formation of the first feature 1110 is obtained. By biasing the width of the first target polygon 1191 by 0.12 um, the exposed polygon 1101 can be formed with the desired critical dimension of about 0.50 um.

The second feature 1120 has a second exposed polygon 1102 having a second width 1125 of about 0.97 um. The second exposed polygon 1102 has a contrast greater than 60% which includes the contrast intervals there above, such as a 70% interval 1107. The second width 1125 of the second exposed polygon 1102 is substantially similar to a second target width 1182 of the second target polygon 1192. Unlike the first target polygon 1191, the second target polygon 1192 was not biased when performing this operation. As shown in the length along exposure (FIG. 11B) the threshold development is greater than 60% and less than % 100, such as about 86%. Thus complete formation of the second feature 1120 is obtained.

The third feature 1130 has a third exposed polygon 1103 having a third width 1135 of about 0.97 um. The third feature 1130 is substantially similar to the second feature 1120 and has similar results in forming the feature.

Figure 12A:
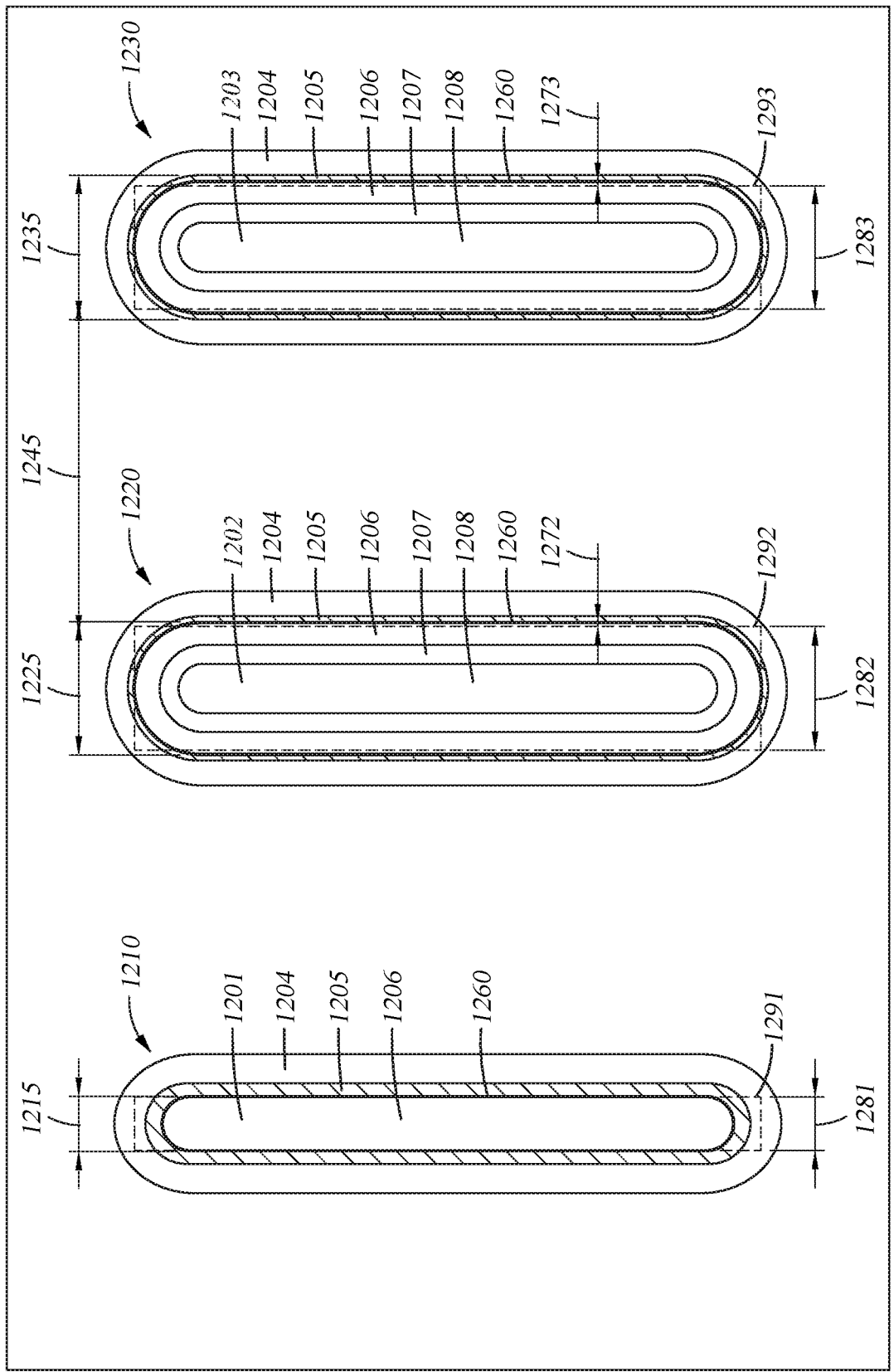
FIG. 12A-12B illustrates a third scheme for enhancing lithography pattern resolution using multiplicity bias without line bias.
Figure 12B:
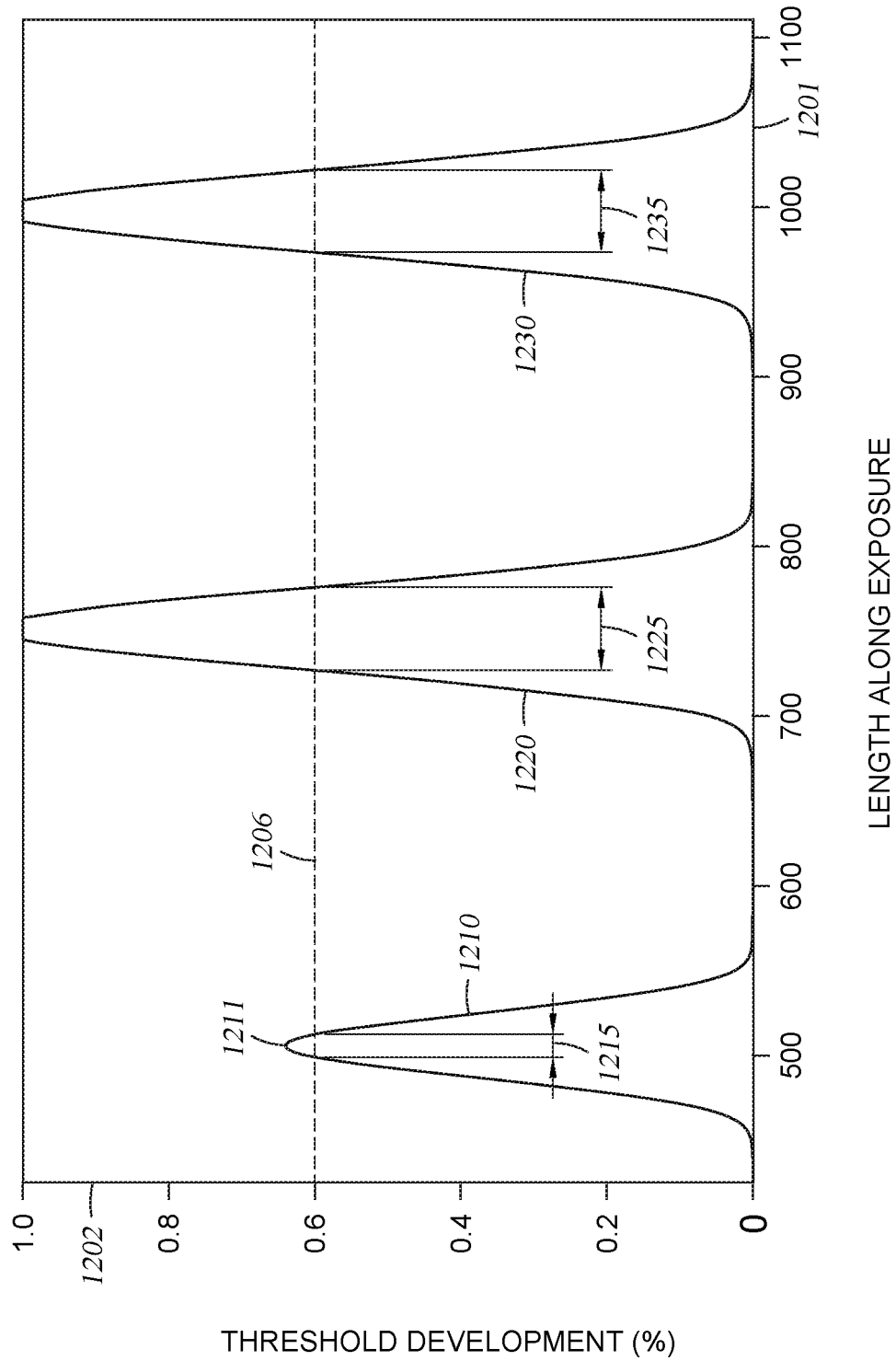

FIGS. 12A and 12B illustrate a study of the effects of multiplicity biasing without line biasing. That is, increasing the number of exposure shots where biased to do so. The study illustrates a first feature 1210, a second feature 1220 and a third feature 1230 formation on a substrate. The first feature 1210 has a first target polygon 1291 having a design width of 0.5. The second feature 1220 has a second target polygon 1292 having a design width of 1.0 um. The third feature 1230 has a third target polygon 1293 having a design width of 1.0 um. A pitch 1245 is shown between the third target polygon 1293 and the second target polygon 1292 having no formation of features therein. The number of exposure shots used to develop the exposed polygon for each of the first feature 1210, the second feature 1220 and the third feature 1230 is biased, i.e., increased, by two or three times over the original number of exposure shots. For example, the number of exposure shots to populate a feature may be about 100 shots evenly. If the 100 shots resulted in an exposed polygon with less than 60% contrast at the target polygon boundary, the number of exposure shots can be increase 2 times to about 200. A percentage increase, such as about 20% where the exposure shots are now about 120, would change the way the shots are populated across the exposure, i.e., it would be non-uniform. Multiples, such as 2, are chosen as a multiplier of the original number of shots. The multiples may be a natural number, or even a real number, which achieves a desired number of shots. For example, a 100-shot pattern may have a multiple applied to the pattern to achieve a 300-shot pattern or even a 303-shot pattern. In one embodiment, two distinct 100-shot patterns overlay on top of each other, obtaining a net 200-shot pattern while maintaining an even distribution for the exposure shots. Alternately, an increase in the percentage of exposure shots may be computed and to layout in an evenly distributed pattern within the target polygon. The first feature 1210 has a first exposed polygon 1201 having a first width 1215 of about 0.51 um. The first exposed polygon 1201 has a contrast greater than 60%. The contrast intervals shown are a 60% interval 1260, a 50% interval 1205 and a 40% interval 1204. The first width 1215 of the first exposed polygon 1201 is substantially the same as a first target width 1281 of the first target polygon 1291. The length along exposure (FIG. 12B) shows a threshold development 1211 greater than 60%, such as about 64%, and thus complete formation of the first feature 1210 is obtained. By biasing the number of shots (multiplicity) on the first target polygon 1291 by 100%, the first exposed polygon 1201 can be formed with the desired critical dimension of about 0.50 um.

The second feature 1220 has a second exposed polygon 1202 having a second width 1225 of about 1.12 um. The second exposed polygon 1202 has a contrast greater than 60%. The contrast intervals shown in addition to those above are a 70% interval 1207 and an 80% interval 1208. The second width 1225 of the second exposed polygon 1202 has a second distance 1272 larger than a second target width 1282 of the second target polygon 1292. The second distance 1272 is between about 0.03 um to about 0.10 um, such as about 0.06 um. Unlike the first exposed polygon 1201, the second exposed polygon 1202 is larger than the design for the critical dimension of the second feature by about 12%. As shown in the length along exposure (FIG. 12B) the threshold development is greater than % 100. Thus, the second feature 1220 is formed oversized.

The third feature 1230 has a third exposed polygon 1203 having a third width 1235 of about 1.12 um. The third feature 1230 is substantially similar to the second feature 1220 and has similar results for forming the feature.

Figure 13A:
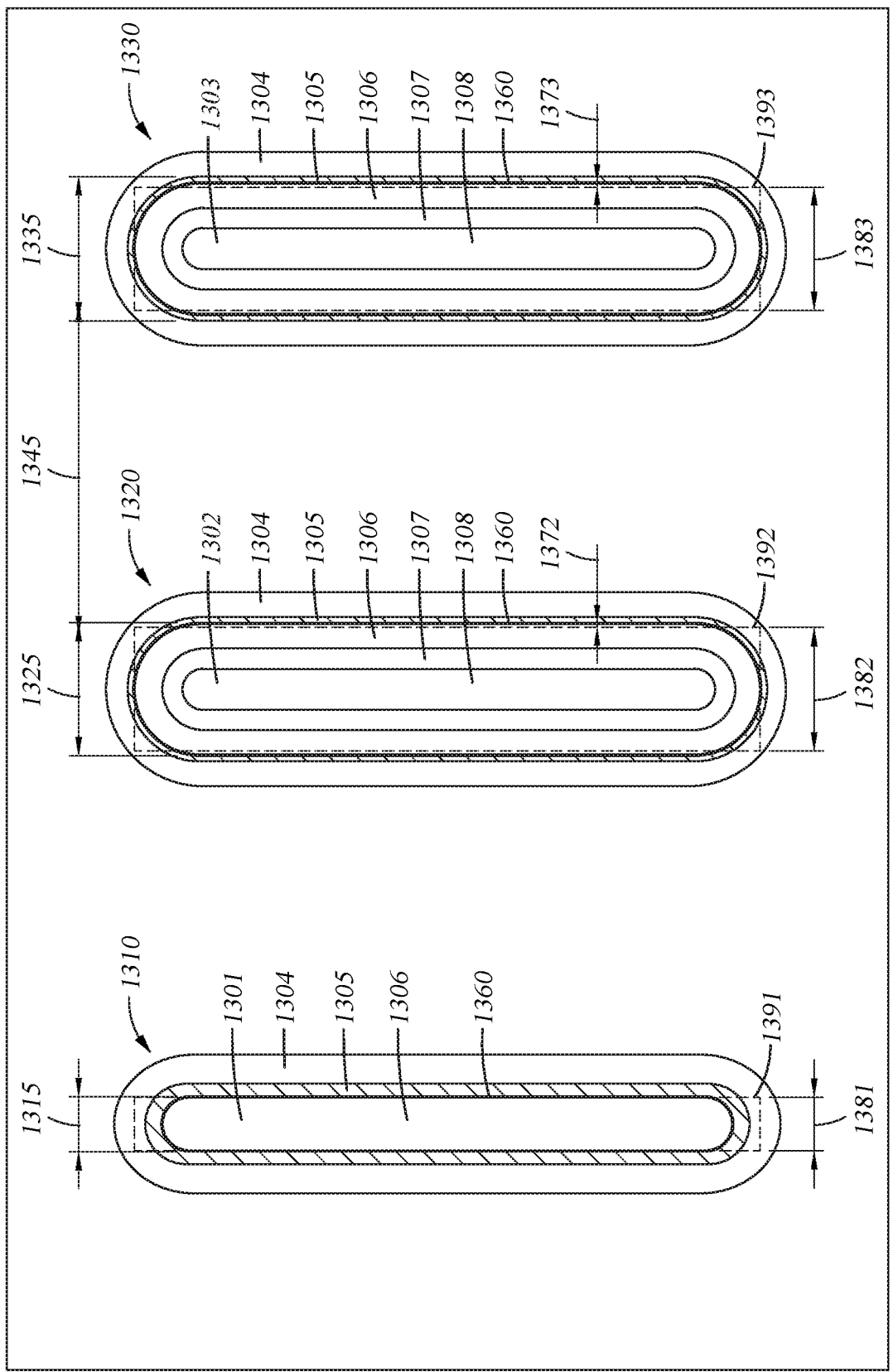
FIG. 13A-13B illustrates a fourth scheme for enhancing lithography pattern resolution using both line bias and multiplicity bias.
Figure 13B:
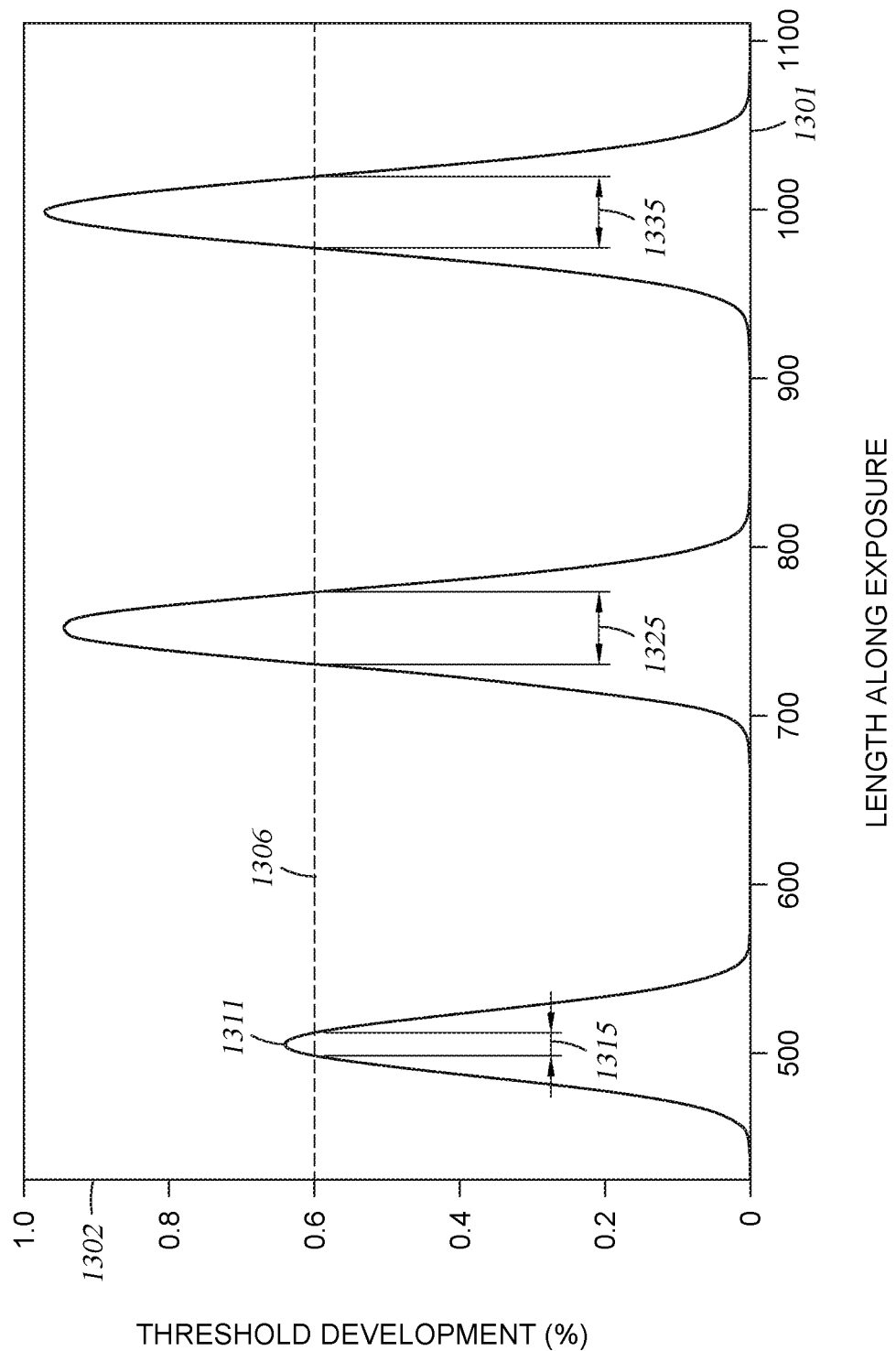

FIGS. 13A and 13B illustrate a study of the effects of multiplicity biasing and line biasing. That is, increasing the number of exposure shots and biasing the target polygon dimension to achieve a 60% threshold at the edge of the target polygons and increasing or decreasing the line width where biased to do so. The study illustrates a first feature 1310, a second feature 1320 and a third feature 1330 formation on a substrate. The first feature 1310 has a first target polygon 1391 having a design width of 0.5. The second feature 1320 has a second target polygon 1392 having a design width of 1.0 um biased down to 0.88 um. The third feature 1330 has a third target polygon 1393 having a design width of 1.0 um biased down to 0.88 um. A pitch 1345 is shown between the third target polygon 1393 and the second target polygon 1392 having no formation of features therein. The number of exposure shots used to develop the exposed polygon for each of the first feature 1310, the second feature 1320 and the third feature 1330 is biased, i.e., increased, by about 2×.

The first feature 1310 has an exposed polygon 1301 having a first width 1315 of about 0.51 um. The exposed polygon 1301 has a contrast greater than 60%. The contrast intervals shown are a 60% interval 1360, a 50% interval 1305 and a 40% interval 1304. The first width 1315 of the exposed polygon 1301 is substantially the same as a first target width 1381 of the first target polygon 1391. The length along exposure (FIG. 13B) shows a threshold development 1311 greater than 60%, such as about 64%, and thus complete formation of the first feature 1310 is obtained. By biasing the number of shots (multiplicity) on the first target polygon 1391 by 100%, the exposed polygon 1301 can be formed with the desired critical dimension of about 0.50 um (measure to be about 0.51 um).

The second feature 1320 has a second exposed polygon 1302 having a second width 1325 of about 0.99 um. The second exposed polygon 1302 has a contrast greater than 60%. The contrast intervals shown in addition to those above are a 70% interval 1307 and an 80% interval 1308. The second width 1325 of the second exposed polygon 1302 is substantially the same as a second target width 1382 of the second target polygon 1392, i.e., a distance 1372 between the second width 1325 and the second target width 1382 approaches zero. The second width 1325 was biased down by about 0.12 um to prevent the second feature 1320 from being oversized due to the increase in the number of shots. As shown in the length along exposure (FIG. 13B) the threshold development is greater than 60% and less than % 100, such as 97%. Thus, the second feature 1320 can be correctly formed.

The third feature 1330 has a third exposed polygon 1303 having a third width 1335 of about 0.99 um. The third feature 1330 is substantially similar to the second feature 1320 and has similar results for forming the feature.

As discussed above with respect to FIGS. 10A through 13B, by increasing the number of shots the large features become too big. By decreasing the dimension of the target polygon these features can be brought back to the target critical dimension. By mixing the line and multiplicity bias, each feature may be formed at the correct dimension when attempting to form features below the resolution of the hardware provided with the DMD. It should be appreciated that the line and multiplicity bias may be performed per feature and not all features may be biased. For example, a first feature may only have a line biased applied thereto, a second feature may only have a multiplicity bias (shot) applied thereto, a third feature may have both the line and multiplicity biased applied thereto while yet a fourth feature has no bias applied at all. It should also be appreciated that the number of shots a feature is biased may be different than another feature also biased in the number of shots. For example a first feature may have a multiplicity bias of 2× while a second feature have a multiplicity bias of 3×. Similarly, the line bias for a first feature may not be the same as that of a second feature. For example, the first feature may have a line bias of +0.12 um while a second feature is biased −0.06 um.

In one embodiment, the image projection system 301 may expose a substrate and deliver light to the surface of the substrate 140. Each exposure may last between approximately about 45 microseconds and about 85 microseconds, for example between about 55 microseconds and about 75 microseconds.

In another embodiment, a computer system to enhance the resolution of maskless lithography while maintaining a high image contrast is provided. The computer system includes a processor and a memory. The memory stores instructions that, when executed by the processor, cause the computer system to enhance the resolution of maskless lithography while maintaining a high image contrast on a substrate. The steps include running an algorithm to provide different polygons with different multiplicity or line bias; determining a centroid grid for a plurality of mirrors in a DMD; shooting electromagnetic radiation to reflect off of a first mirror of the DMD; and reflecting the light to form a digitized pattern on the target to expose a photo-resist.

In yet another embodiment, a non-transitory computer-readable storage medium, storing instructions that, when executed by the processor, cause the computer system to enhance the resolution of maskless lithography while maintaining a high image contrast. The steps include running an algorithm to provide different polygons with different multiplicity or line bias; determining a centroid grid for a plurality of mirrors in a DMD; shooting electromagnetic radiation to reflect off of a first mirror of the DMD and reflecting the light to form a digitized pattern on the target to expose a photo-resist.

Benefits of the embodiments disclosed herein extending a high volume manufacturing (HVM) tool to a lower resolution through the method 900 discussed above. At the threshold value for the contrast, it can be shown that a DMD suitable for 3.6 μm sized pixels can generate pixels sized about 2.35 μm. Similarly, a DMD suitable for producing 1.25 μm sized pixels can be extended to generate 0.85 μm sized pixels. Additionally, a DMD suitable for generating 0.6 μm sized pixels can be extended to generate 0.4 μm sized pixels without changing any hardware.

While the foregoing is directed to embodiments described herein, other and further embodiments may be devised without departing from the basic scope thereof. For example, aspects of the present disclosure may be implemented in hardware or software or in a combination of hardware and software. One embodiment described herein may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (for example, read-only memory devices within a computer such as CD-ROM disks readable by a CD-ROM drive, flash memory, ROM chips or any type of solid-state non-volatile semiconductor memory) on which information is permanently stored; and (ii) writable storage media (for example, floppy disks within a diskette drive or hard-disk drive or any type of solid-state random-access semiconductor memory) on which alterable information is stored. Such computer-readable storage media, when carrying computer-readable instructions that direct the functions of the disclosed embodiments, are embodiments of the present disclosure.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A method to enhance the resolution of maskless lithography while maintaining a high image contrast on a substrate, comprising:
    running an algorithm to provide different target polygons for forming a pattern on a target;
    determining a minimum feature size which may be formed by a DMD, wherein the minimum feature size is a function of the DMD mirror size and the hardware lens;
    determining to line bias or shot bias the one or more target polygons to achieve an acceptable exposure contrast at the target polygon boundary for each target polygons smaller than the minimum feature size, wherein line biasing comprises increasing the size of the target polygon and shot biasing comprises increasing the number of electromagnetic radiation shots in the target polygon;
    biasing the one or more target polygons smaller than the minimum feature size to form a digitized pattern on the substrate; and
    delivering a shot of electromagnetic radiation to reflect off of a first mirror of the DMD when the centroid for the first mirror is within the one or more target polygons.

2. The method of claim 1, further comprising:
    repeating the delivery of shots in the target polygons until the exposure contrast inside the target polygons are greater a development threshold and the exposure contrast outside the polygons are less than the development threshold.

3. The method of claim 1, wherein biasing the one or more target polygons comprises:
    decreasing the width of a first target polygon of the one or more target polygons.

4. The method of claim 1, wherein biasing the one or more target polygons comprises:
    increasing the number of shots of electromagnetic radiation for a second target polygon of the one or more target polygons.

5. The method of claim 4, wherein the number of shots is increased by a multiplier.

6. The method of claim 5, wherein exposing forms a pattern in the photoresist.

7. The method of claim 1, wherein the contrast outside the target polygon is less than a development threshold and the contrast inside the target polygon is greater than the development threshold.

8. A computer system for enhancing the resolution of maskless lithography while maintaining a high image contrast on a substrate, comprising:
- a processor; and
- a memory storing instructions that, when executed by the processor, cause the computer system to:
  - running an algorithm to provide different target polygons for forming a pattern on a target;
  - determining a minimum feature size which may be formed by a DMD, wherein the minimum feature size is a function of the DMD mirror size and the hardware lens;
  - determining to line bias or shot bias the one or more target polygons to achieve an acceptable exposure contrast at the target polygon boundary for each target polygons smaller than the minimum feature size, wherein line biasing comprises increasing the size of the target polygon and shot biasing comprises increasing the number of electromagnetic radiation shots in the target polygon;
  - biasing the one or more target polygons smaller than the minimum feature size to form a digitized pattern on the substrate; and
  - delivering a shot of electromagnetic radiation to reflect off of a first mirror of the DMD when the centroid for the first mirror is within the one or more target polygons.

9. The computer system of claim 8, further comprising:
repeating the delivery of shots in the target polygons until the exposure contrast inside the target polygons are greater than a development threshold and the exposure contrast outside the polygons are less than the development threshold.

10. The computer system of claim 8, wherein biasing the one or more target polygons comprises:
decreasing the width of a first target polygon of the one or more target polygons.

11. The computer system of claim 8, wherein biasing the one or more target polygons comprises:
increasing the number of shots of electromagnetic radiation for a second target polygon of the one or more target polygons.

12. The computer system of claim 11, wherein the number of shots is increased by a multiplier.

13. The computer system of claim 12, wherein exposing forms a pattern in the photoresist.

14. The computer system of claim 8, wherein the contrast outside the target polygon is less than a development threshold and the contrast inside the target polygon is greater than the development threshold.

15. A non-transitory computer-readable medium storing instructions that, when executed by a processor, cause a computer system to enhance the resolution of maskless lithography while maintaining a high image contrast on a substrate, by performing the steps of:
- running an algorithm to provide different target polygons for forming a pattern on a target;
- determining a minimum feature size which may be formed by a DMD, wherein the minimum feature size is a function of the DMD mirror size and the hardware lens;
- determining to line bias or shot bias the one or more target polygons to achieve an acceptable exposure contrast at the target polygon boundary for each target polygons smaller than the minimum feature size, wherein line biasing comprises increasing the size of the target polygon and shot biasing comprises increasing the number of electromagnetic radiation shots in the target polygon;
- biasing the one or more target polygons smaller than the minimum feature size to form a digitized pattern on the substrate; and
- delivering a shot of electromagnetic radiation to reflect off of a first mirror of the DMD when the centroid for the first mirror is within the one or more target polygons.

16. The non-transitory computer-readable medium of claim 15, further comprising:
repeating delivery of shots in the target polygons until the exposure contrast inside the target polygons are greater than a development threshold and the exposure contrast outside the polygons are less than the development threshold.

17. The non-transitory computer-readable medium of claim 15, wherein biasing the one or more target polygons comprises:
decreasing the width of a first target polygon of the one or more target polygons.

18. The non-transitory computer-readable medium of claim 15, wherein biasing the one or more target polygons comprises:
increasing the number of shots of electromagnetic radiation for a second target polygon of the one or more target polygons.

19. The non-transitory computer-readable medium of claim 18, wherein the number of shots is increased by a multiplier.

20. The non-transitory computer-readable medium of claim 15, wherein the contrast outside the target polygon is less than a development threshold and the contrast inside the target polygon is greater than the development threshold.

* * * * *